(12) United States Patent
Dandu

(10) Patent No.: US 11,985,798 B2
(45) Date of Patent: May 14, 2024

(54) METHOD AND SYSTEM FOR FLEXIBLE HEAT SPREADER ATTACHMENT

(71) Applicant: ARRIS Enterprises LLC, Suwanee, GA (US)

(72) Inventor: Pridhvi Dandu, Rancho Cordova, CA (US)

(73) Assignee: ARRIS Enterprises LLC, Horsham, PA (US)

( * ) Notice: Subject to any disclaimer, the term of this patent is extended or adjusted under 35 U.S.C. 154(b) by 45 days.

(21) Appl. No.: 17/494,074

(22) Filed: Oct. 5, 2021

(65) Prior Publication Data

US 2022/0110221 A1 Apr. 7, 2022

Related U.S. Application Data

(60) Provisional application No. 63/088,076, filed on Oct. 6, 2020, provisional application No. 63/088,101, filed on Oct. 6, 2020.

(51) Int. Cl.
*H05K 7/20* (2006.01)
*H05K 1/02* (2006.01)

(52) U.S. Cl.
CPC ......... *H05K 7/2049* (2013.01); *H05K 1/0204* (2013.01)

(58) Field of Classification Search
CPC .. H05K 7/1405; H05K 7/2039; H05K 7/2049; H05K 7/20509; H05K 1/0204; H05K 9/0028; H05K 9/0032; H05K 9/0035
See application file for complete search history.

(56) References Cited

U.S. PATENT DOCUMENTS

| | | | | |
|---|---|---|---|---|
| 4,575,038 A * | 3/1986 | Moore | ...... | H05K 7/12 361/717 |
| 5,697,071 A * | 12/1997 | Fan | ...... | H04B 1/3833 224/269 |
| 5,774,335 A * | 6/1998 | Pare | ...... | H01L 23/4093 361/717 |
| 5,818,695 A * | 10/1998 | Olson | ...... | H01L 23/4093 174/16.3 |
| 5,975,469 A * | 11/1999 | Chen | ...... | G06F 3/0395 248/118.1 |
| 6,370,026 B2 * | 4/2002 | Sunaga | ...... | H02K 11/33 257/719 |
| 7,327,577 B2 * | 2/2008 | Gilliland | ...... | H01L 23/552 361/720 |

(Continued)

*Primary Examiner* — Jacob R Crum
*Assistant Examiner* — Matthew Sinclair Muir
(74) *Attorney, Agent, or Firm* — Panitch Schwarze Belisario & Nadel LLC

(57) ABSTRACT

An apparatus and system for temperature mitigation and, more particularly, a flexible heat spreader attachment that flexibly attaches to the periphery of a circuit board, allowing for its use with numerous circuit board shapes and sizes, including those of irregular shapes and sizes. The flexible heat spreader attachment includes a base plate, a heat spreader attached to the base plate, and four adjustable arms attached to the base plate, wherein each of the adjustable arms include circuit board hooks configured to attach to the periphery of a circuit board and maintain the heat spreader at a desired location on, and spaced from, the circuit board.

17 Claims, 20 Drawing Sheets

(56) References Cited

U.S. PATENT DOCUMENTS

| | | | |
|---|---|---|---|
| 7,518,873 B2* | 4/2009 | Park | H01L 23/4093 |
| | | | 165/185 |
| 8,320,129 B2* | 11/2012 | Chan | H01L 23/4006 |
| | | | 165/185 |
| 8,755,192 B1* | 6/2014 | Schrempp | H05K 7/20736 |
| | | | 361/752 |
| 8,944,149 B2* | 2/2015 | Zhou | H01L 23/4006 |
| | | | 248/220.21 |
| 10,208,891 B2* | 2/2019 | Myerchin | F16M 11/38 |
| 2006/0139890 A1* | 6/2006 | Liu | H01L 23/4093 |
| | | | 257/E23.086 |
| 2007/0097649 A1* | 5/2007 | Yang | H01L 23/4006 |
| | | | 257/E23.084 |
| 2013/0163207 A1* | 6/2013 | Chen | H01L 23/4006 |
| | | | 361/720 |
| 2014/0063731 A1 | 3/2014 | Fang | |
| 2014/0146479 A1 | 5/2014 | Kilroy et al. | |
| 2017/0196121 A1 | 7/2017 | Trygubova et al. | |
| 2020/0122316 A1* | 4/2020 | Tsang | B25J 9/104 |
| 2020/0182433 A1* | 6/2020 | Hemon | F21S 45/48 |
| 2020/0254625 A1* | 8/2020 | Rogers | B25J 9/1664 |

* cited by examiner

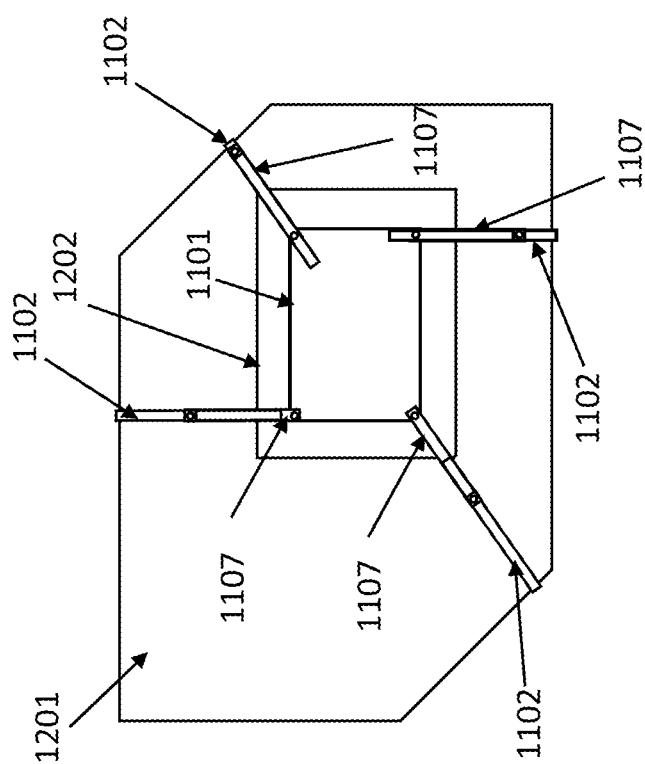
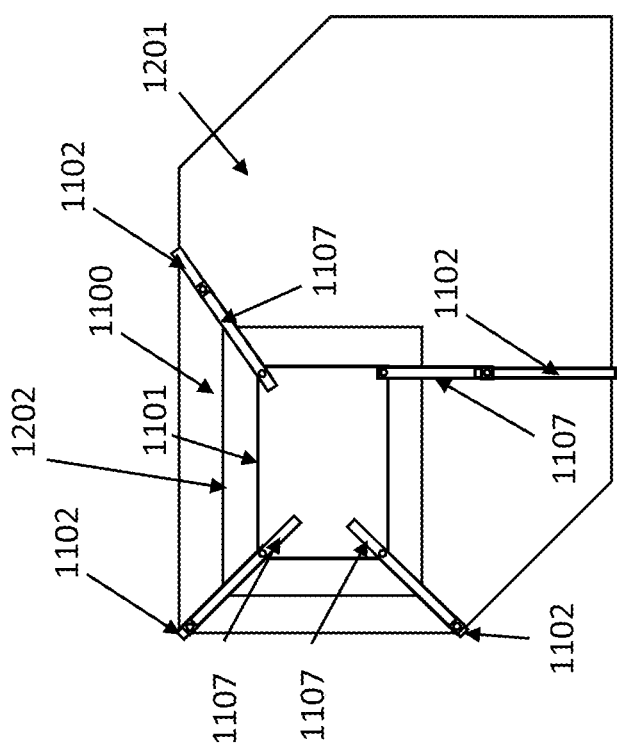
FIG. 5A

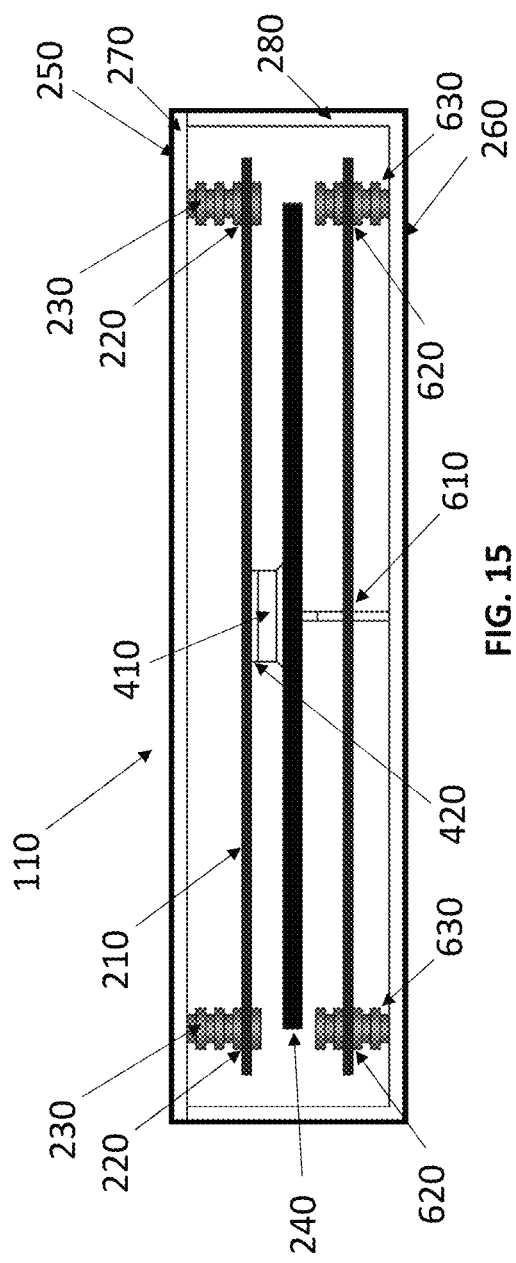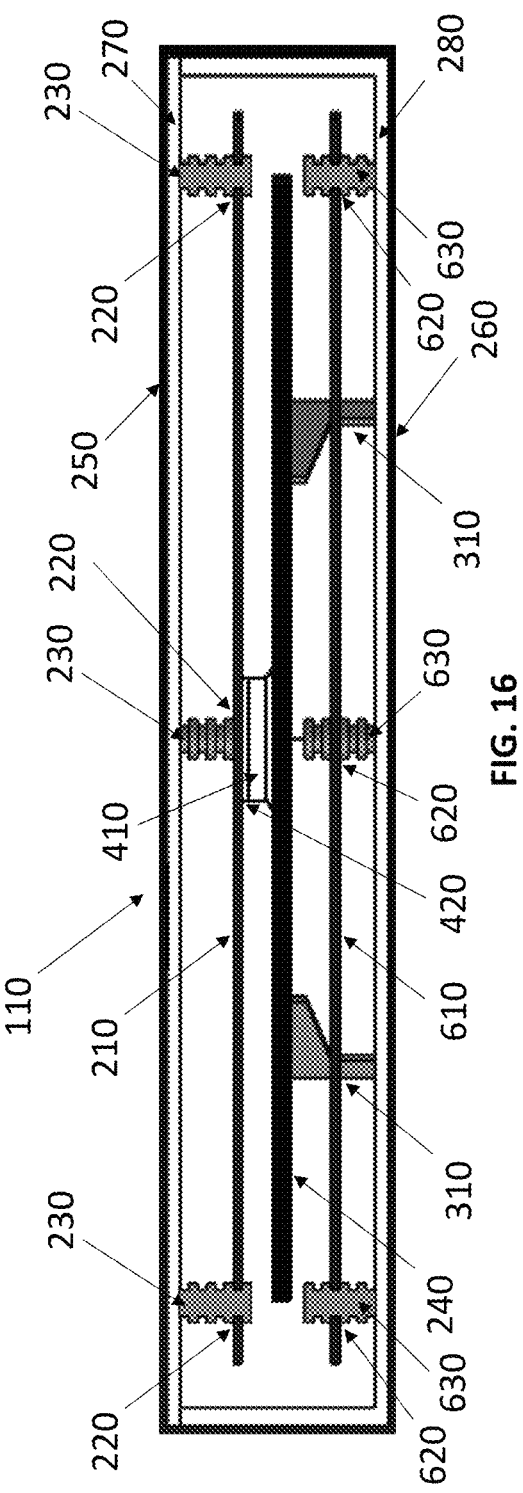

METHOD AND SYSTEM FOR FLEXIBLE HEAT SPREADER ATTACHMENT

CROSS-REFERENCE TO RELATED APPLICATIONS

This patent application claims the benefit of and priority to U.S. Provisional Patent Application Nos. 63/088,076 and 63/088,101, each filed on Oct. 6, 2020, which are hereby incorporated by reference in their entireties.

TECHNICAL FIELD

The present disclosure generally relates to an apparatus and system for temperature mitigation and, more particularly, a flexible heat spreader attachment that flexibly attaches to the periphery of a circuit board, allowing for its use with numerous circuit board shapes and sizes, including those of irregular shapes and sizes.

BACKGROUND

Enclosed electronic devices that include at least one circuit board generate and emit heat during operation, particularly those with small footprints such as, for example, set-top boxes. Maintaining surface temperature (touch) and component temperatures of such devices is important for safety and product reliability, including the physical handling of such devices by humans. Manufacturing and technical specifications of such devices often include specific requirements regarding surface temperature or component temperatures during operation.

Several techniques exist to spread heat emitted by circuit boards included within the enclosure of electronic devices, which assists in controlling and mitigating the surface temperature or component temperatures of those devices. These include the use of heat spreaders. Various techniques involve the use of adjustable heat spreaders that maintain contact with an internal circuit board, and in some cases maintain contact with a heat spreading aspect of the enclosure of the electronic device. However, none of these heat spreaders are designed to attach to numerous circuit boards of differing shapes and sizes, including irregularly shaped and sized circuit boards.

Thus, while there are techniques available to generally control heat of enclosed electronic devices using heat spreaders, a technique that provides flexibility to attach a heat spreader to numerous circuit boards of differing shapes and sizes, including irregularly shaped and sized circuit boards, is needed.

The present disclosure is directed toward overcoming one or more of the above-identified problems, although not necessarily limited to embodiments that do.

SUMMARY

In accordance with exemplary embodiments, it would be desirable to have a flexible heat spreader attachment that flexibly attaches to the periphery of a circuit board, allowing for its use with numerous circuit board shapes and sizes, including those of irregular shapes and sizes.

In accordance with an aspect, a flexible heat spreader attachment is provided, the heat spreader attachment comprising: a base plate, a heat spreader attached to the base plate, and four adjustable arms attached to the base plate, wherein each of the adjustable arms include circuit board hooks configured to attach to the periphery of a circuit board and maintain the heat spreader at a desired location on, and spaced from, the circuit board.

In accordance with another aspect, an enclosure for a circuit board is provided, the enclosure comprising: a flexible heat spreader attachment comprising a base plate, a heat spreader attached to the base plate, and four adjustable arms attached to the base plate, wherein each of the adjustable arms include circuit board hooks configured to attach to the periphery of the circuit board and maintain the heat spreader at a desired location on, and spaced from, the circuit board.

In accordance with yet another aspect, a method of manufacturing an enclosure for a circuit board is provided, the method comprising: deploying a flexible heat spreader attachment comprising a base plate, a heat spreader attached to the base plate, and four adjustable arms attached to the base plate, and attaching circuit board hooks of the four adjustable arms of the flexible heat spreader attachment to the periphery of the circuit board to maintain the heat spreader at a desired location on, and spaced from, the circuit board.

In accordance with additional exemplary embodiments, it would be desirable to have a heat transfer apparatus and system for surface and component temperature mitigation for electronic devices such as set-top boxes with at least one circuit board.

In accordance with an aspect, a heat transfer apparatus is provided, the heat transfer apparatus comprising: a heat spreader plate configured to spread heat emitted by a circuit board, wherein the heat spreader plate includes at least two adjustment holes configured to receive ribbed posts, wherein the heat spreader plate is configured to be adjustable along lengths of the ribbed posts relative to the circuit board to reduce the surface temperature of an enclosure including the heat spreader plate and the circuit board.

In accordance with another aspect, an enclosure for a circuit board is provided, the enclosure comprising: at least two ribbed posts configured to insert into adjustment holes of a heat spreader plate of a heat transfer apparatus configured to spread heat emitted by the circuit board, wherein the heat spreader plate is configured to be adjustable along lengths of the ribbed posts relative to the circuit board to reduce the surface temperature of the enclosure.

In accordance with yet another aspect, a method of manufacturing an electronic device including a circuit board is provided, the method comprising: inserting at least two ribbed posts of an enclosure into two adjustment holes of a heat spreader plate configured to spread heat emitted by the circuit board, and adjusting the heat spreader plate on the ribbed posts relative to the circuit board to reduce the surface temperature of the enclosure, wherein the heat spreader plate is adjusted to prescribed ribs of the ribbed posts corresponding to a specified surface temperature of the enclosure during operation of the electronic device.

A variety of additional inventive aspects will be set forth in the description that follows. The inventive aspects can relate to individual features and combinations of features. It is to be understood that both the foregoing general description and the following detailed description are exemplary and explanatory only and are not restrictive of the broad inventive concepts upon which the embodiments disclosed herein are based.

BRIEF DESCRIPTION OF THE DRAWINGS

FIGS. 5A-5B illustrate an embodiment of a flexible heat spreader attachment attached to an irregularly shaped circuit board at different locations, to reduce the intensity of an isolated hot spot on the bottom of the circuit board.

FIG. 15 is a cross-section view of an embodiment of an electronic device enclosure with two heat spreader plates, with one heat spreader plate thermally interfacing with a semiconductor element, along the x-cross section as shown in FIG. 1.

FIG. 16 is a cross-section view of an embodiment of an electronic device enclosure with two heat spreader plates, with one heat spreader plate thermally interfacing with a semiconductor element as illustrated in FIG. 15, along the y-cross section as shown in FIG. 1.

DETAILED DESCRIPTION

Figure 1:
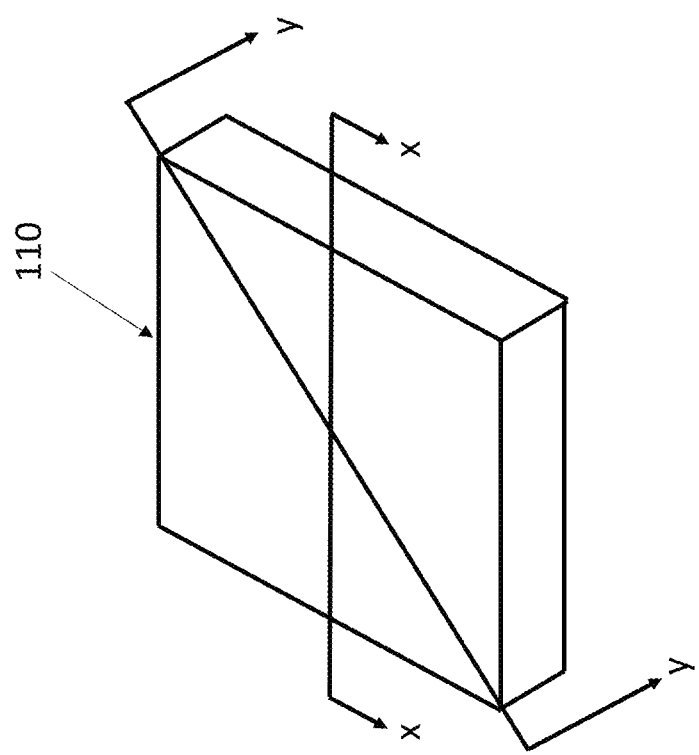
FIG. 1 is an illustration of an electronic device enclosure implementing embodiments of the present disclosure.
Figure 2:
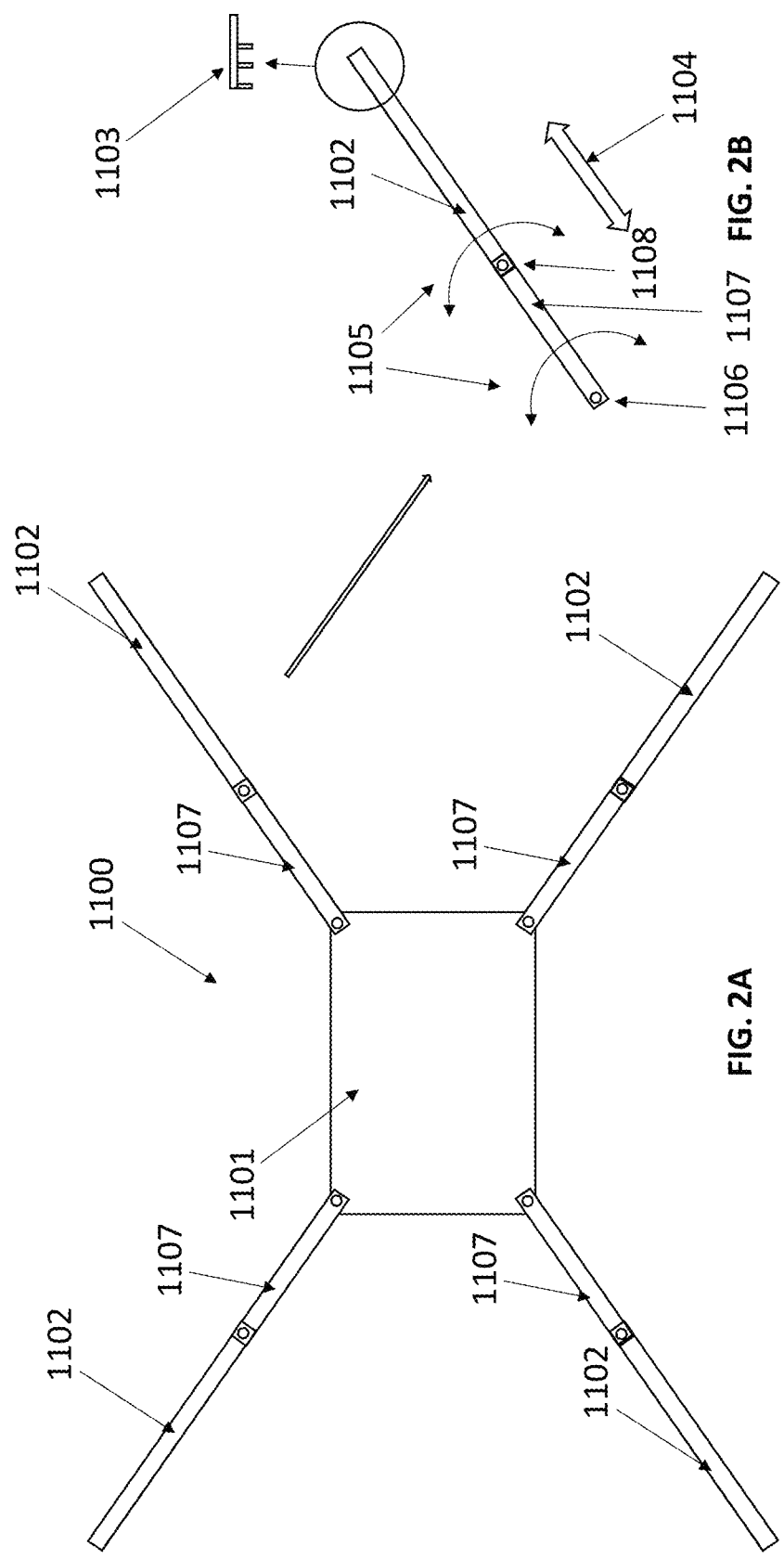
FIG. 2A an illustration of an embodiment of a flexible heat spreader attachment.
FIG. 2B is a detailed view of an adjustable arm of the flexible heat spreader attachment illustrated in FIG. 2A.

FIG. 1 is an illustration of an electronic device enclosure 110 implementing embodiments of the present disclosure. In certain embodiments, the electronic device enclosure 110 is an enclosure of a set-top box, a modem, a router, or an Internet of Things device. As shown in FIG. 1, there are two cross sections: (1) x-x as the x-cross section and (2) y-y as the y-cross section. Embodiments of the present disclosure are discussed with respect to these cross-sections in connection with FIGS. 2-27 below.

FIG. 2A an illustration of an embodiment of a flexible heat spreader attachment 1100. The flexible heat spreader attachment 1100 includes a base plate 1101, and four adjustment arms 1102 attached to the base plate 1101.

FIG. 2B is a detailed view of an adjustable arm 1102 of the flexible heat spreader attachment 1100 illustrated in FIG. 2A. As shown in FIG. 2B, adjustable arm 1102 includes a plurality of circuit board hooks 1103. Circuit board hooks 1103 are configured to attach to the periphery of a circuit board (not illustrated) and maintain a heat spreader (not illustrated) attached to the base plate 1101 at a desired location on, and spaced from, the circuit board (not illustrated), as illustrated in greater detail in FIGS. 3-7 below. In some embodiments, only one circuit board hook 1103, with opposing surfaces that may attach to the periphery of a circuit board 1201, is provided for an adjustable arm 1102. In some embodiments, the adjustable arm 1102 is configured to extend and retract in length 1104 (i.e., is telescopic). As illustrated in FIG. 2A, the adjustable arms 1102 are extended to their full length. The embodiment shown in FIG. 2B also includes a sub-adjustable arm 1107, such that adjustment arm 1102 is comprised of two sub-adjustable arms. In some embodiments, each sub-adjustable arm is telescopic. In the embodiment illustrated in FIG. 2B, the adjustable arm 1102 is configured to pivot in the same plane 1105 parallel to the base plate (1101 of FIG. 2A) about two pivot hinges 1106 and 1108 of the two sub-adjustable arms. In some embodiments, the adjustable arm 1102 may pivot a total of 120-degrees. In some embodiments where the adjustable arm 1102 is comprised of two sub-adjustable arms, each sub-adjustable arm may pivot a total of 120-degrees. Of course, other degrees of adjustability/pivotability are contemplated. The combination of any one of the ability to extend and retract in length, the existence of two sub-adjustable arms, and the ability to pivot in the same plane to the base plate, provides versatility to the adjustment arms 1102 to allow the heat spreader attachment 1100 to attach to the periphery of a circuit board (not illustrated) and maintain a heat spreader (not illustrated) attached to the base plate 1101 at a desired location on, and spaced from, the circuit board (not illustrated).

Figure 3:
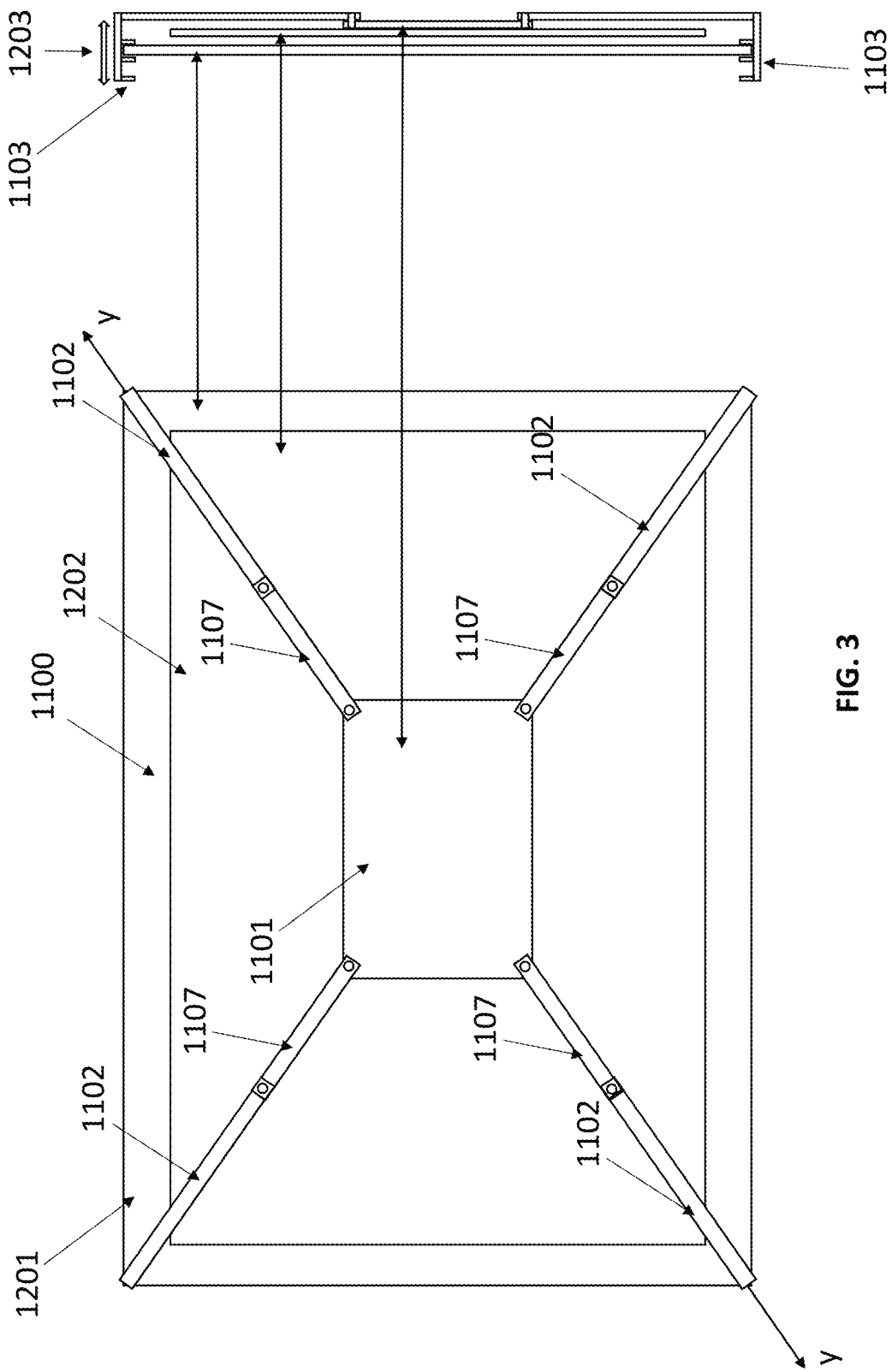
FIG. 3 is an illustration of an embodiment of a flexible heat spreader attachment attached to a regularly shaped circuit board, including a side-view of the heat spreader attachment attached to the regularly shaped circuit board.

FIG. 3 is an illustration of an embodiment of a flexible heat spreader attachment 1100 attached to a regularly shaped circuit board 1201, including a side-view of the heat spreader attachment 1100 attached to the regularly shaped circuit board 1201. Use of the heat spreader attachment 1100 as illustrated in FIG. 3 avoids the need to drill holes into circuit board 1201, and also allows for the use of an off-the-shelf solution. In the embodiment illustrated in FIG. 3, circuit board 1201 is a regularly shaped rectangular circuit board, and the attachment of the heat spreader attachment 1100 may be to the bottom or the top of the circuit board 1201. In the embodiment of FIG. 3, a heat spreader 1202 is attached to the base plate 1101. Circuit board 1201 emits heat during operation of its electronic device (not illustrated). Heat spreader 1202 spreads heat emitted by the circuit board 1201. Such heat spreading may reduce the surface temperature of an enclosure of the circuit board's 1201 electronic device (not illustrated), and may also reduce component temperatures of the circuit board 1201. The heat spreader 1202 may be glued to the base plate or attached in any other suitable manner. The heat spreader 1202 may thermally interface with a semiconductor element (not illustrated) of the circuit board 1201 through a thermal interface (not illustrated), to spread heat emitted by the semiconductor transferred to the heat spreader 1202 in-part through the thermal interface. In some embodiments, the thermal interface may be a thermal interface material such as thermal paste, thermal adhesive, a thermally conductive pad, or thermal tape. In some embodiments, the semiconductor element is an integrated circuit element such as a memory, a microcontroller, a microprocessor, programmable logic array, or an application-specific integrated circuit. In some embodiments, the semiconductor element is a main processor of the circuit board 1201.

In the embodiment illustrated in FIG. 3, each of the adjustment arms 1102 include a sub-adjustment arm 1107, and are thus comprised of two sub-adjustment arms. The adjustment arms 1102 have been adjusted to allow the heat spreader attachment 1100 to be attached to the periphery of the circuit board 1201 to maintain the heat spreader 1100 at a desired location on, and spaced from, the circuit board 1201. In the embodiment of FIG. 3, the circuit board 1201 is attached to the top setting of the plurality of circuit board hooks 1103 on each of the adjustment arms as shown in the side-view of the heat spreader attachment 1100 attached to the regularly shaped circuit board 1201. As detailed more fully in FIGS. 6 and 7, the additional settings provided by the plurality of circuit board hooks 1103 are configured to allow adjustment of the spatial distance of the heat spreader 1202 to the desired location on, and spaced from, the circuit board.

In general, the closer the heat spreader 1202 is adjusted towards the circuit board 1201 and further away from the surface of an electronic device enclosure (not illustrated) housing the circuit board 1201, the lower the surface temperature of the enclosure. And, in general, the further away from the circuit board 1201 the heat spreader 1202 is adjusted, towards a surface of electronic device enclosure (not illustrated) housing the circuit board 1201, the higher the surface temperature of the enclosure.

Figure 4:
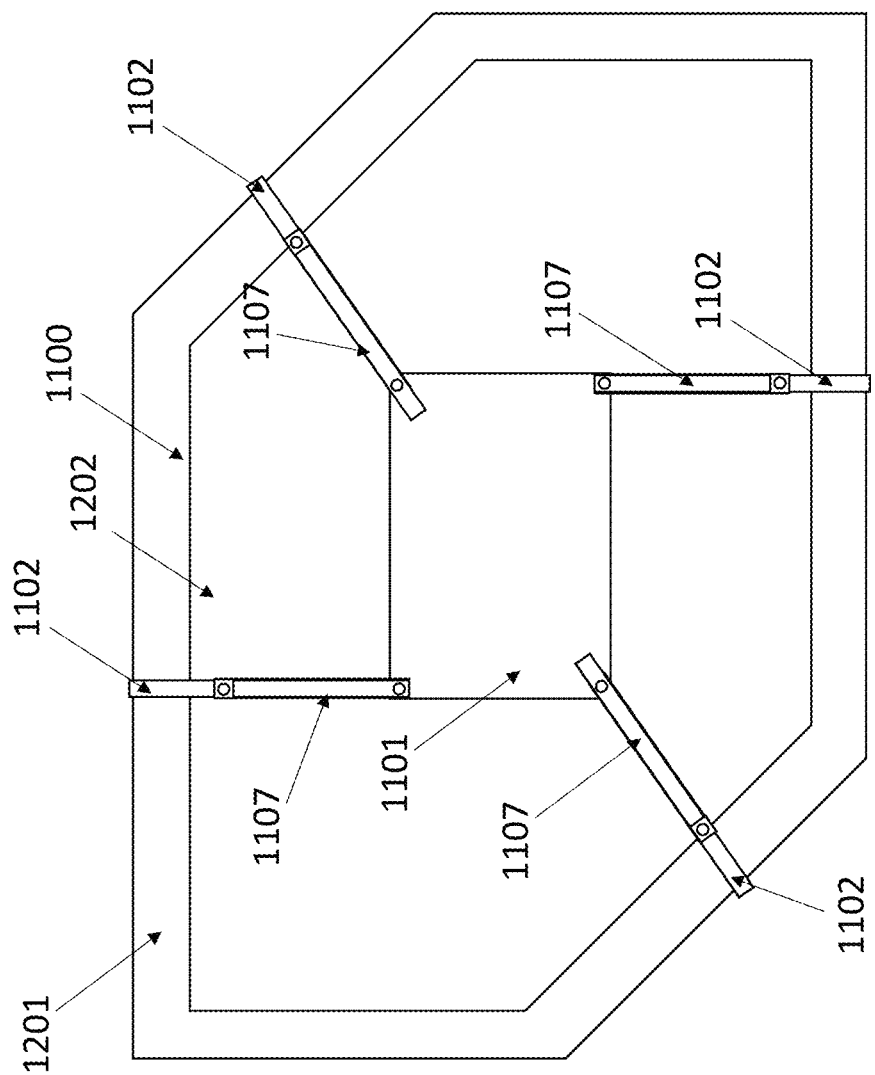
FIG. 4 is an illustration of an embodiment of a flexible heat spreader attachment attached to an irregularly shaped circuit board.

FIG. 4 is an illustration of an embodiment of a flexible heat spreader attachment 1100 attached to an irregularly shaped circuit board 1201. The embodiment of FIG. 4 demonstrates the flexibility of the heat spreader attachment 1100 of the present disclosure. As illustrated in FIG. 4, each of the adjustment arms 1102 have been adjusted to allow the heat spreader attachment 1100 to be attached to the periphery of the circuit board 1201 to maintain the heat spreader 1202 at a desired location on, and spaced from, the circuit board 1201. In particular, FIG. 4 highlights the ability of the adjustment arms 1102 to extend and retract in length, as well as pivot in a plane parallel to the base plate 1101, to accommodate any position necessary to allow for attachment to the periphery of the circuit board 1201. As illustrated in FIG. 4, a heat spreader 1202 has been attached to base plate 1101 that matches the geometric profile of circuit board 1201, demonstrating yet another flexible and unique feature the presently disclosed heat spreader attachment 1100, allowing it to be used with numerous circuit board shapes and sizes, including those of irregular shapes and sizes. Use of the heat spreader attachment 1100 as illustrated in FIG. 4 avoids the need to drill holes into circuit board 1201, and also allows for the use of an off-the-shelf solution instead of a custom heat spreader solution that would be necessary for such an irregularly shaped circuit board 1201.

Figure 5B:
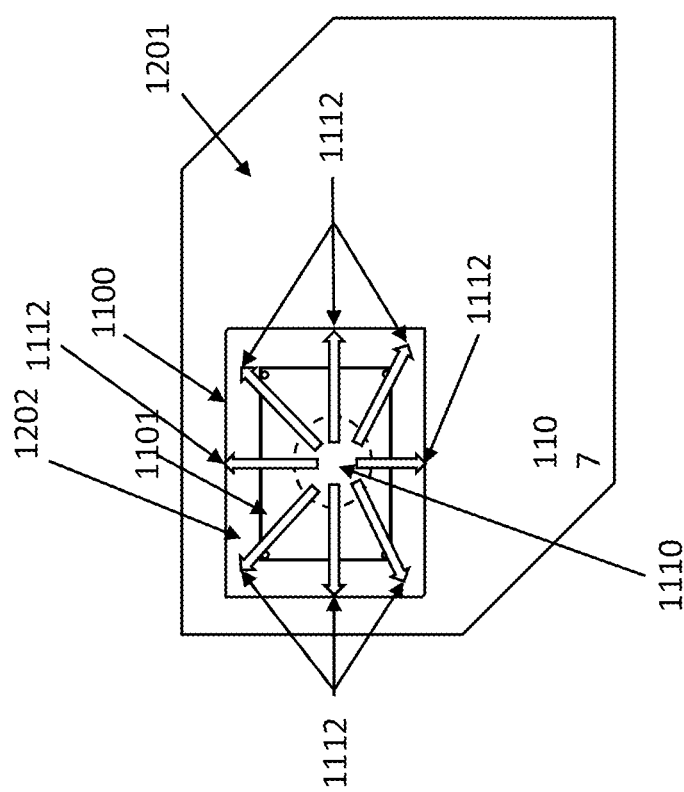

FIG. 5A is an illustration of an embodiment of a flexible heat spreader attachment 1100 attached to two irregularly shaped circuit boards 1201 in different locations, to reduce the intensity of an isolated hot spot on the bottom of the circuit boards 1201. As in FIG. 4, FIG. 5A highlights the ability of the adjustment arms 1102 to extend and retract in length, as well as pivot in a plane parallel to the base plate 1101, to accommodate any position necessary to allow for attachment to the periphery of the circuit boards 1201. As illustrated in FIG. 5A, which shows the heat spreader attachment 1100 attached to an irregularly shaped circuit board at different locations to reduce the intensity of an isolated hot spot, e.g., hot spot 1110 as illustrated in FIG. 5B, on the bottom of the circuit board, some of the adjustment arms 1102 are adjusted to half their length, while other are adjusted to their full length, demonstrating the flexibility of the presently disclosed heat spreader attachment 1100 to accommodate any position necessary to allow for attachment to the periphery of the circuit boards 1201. Here, as illustrated in FIG. 5B, attachment of to the circuit boards 1201 in this flexible manner allows the flexible heat spread attachment 1100 to reduce the intensity, e.g., dissipate the heat as illustrated by the arrows 1112, of an isolated hot spot 1110 on the bottom of the circuit boards 1201, regardless of that hot spot 1110 position. Use of the heat spreader attachment 1100 as illustrated in FIGS. 5A-5B avoids the need to drill holes into circuit boards 1201, and also allows for the use of an off-the-shelf solution instead of a custom heat spreader solution that would be necessary for such the irregularly shaped circuit boards 1201.

Figure 6:
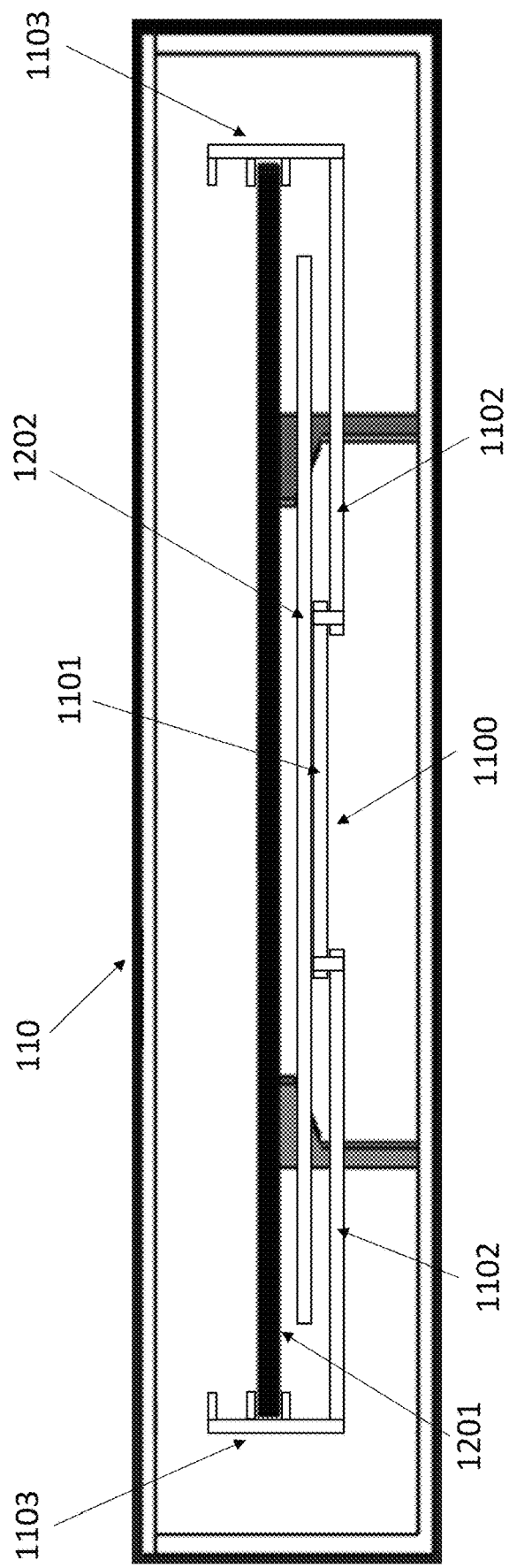
FIG. 6 is a cross-section view of the embodiment of a heat spreader attachment attached to a regularly shaped circuit board as illustrated in FIG. 3 within an electronic device disclosure, along the y-cross section as shown in FIGS. 3 and 1.

FIG. 6 is a cross-section view of the embodiment of a heat spreader attachment 1100 attached to a regularly shaped circuit board 1201 as illustrated in FIG. 3 within an electronic device enclosure 110, along the y-cross section as shown in FIGS. 3 and 1. As illustrated in FIG. 6 the heat spreader attachment 1100 includes two adjustment arms 1102, and a heat spreader 1202 attached to the base plate 1101. The adjustment arms 1102 include a plurality of circuit board hooks 1103. In the embodiment of FIG. 6, the circuit board 1201 is attached to a lower setting of the plurality of circuit board hooks 1103 on each of the adjustment arms 1102.

Figure 7:
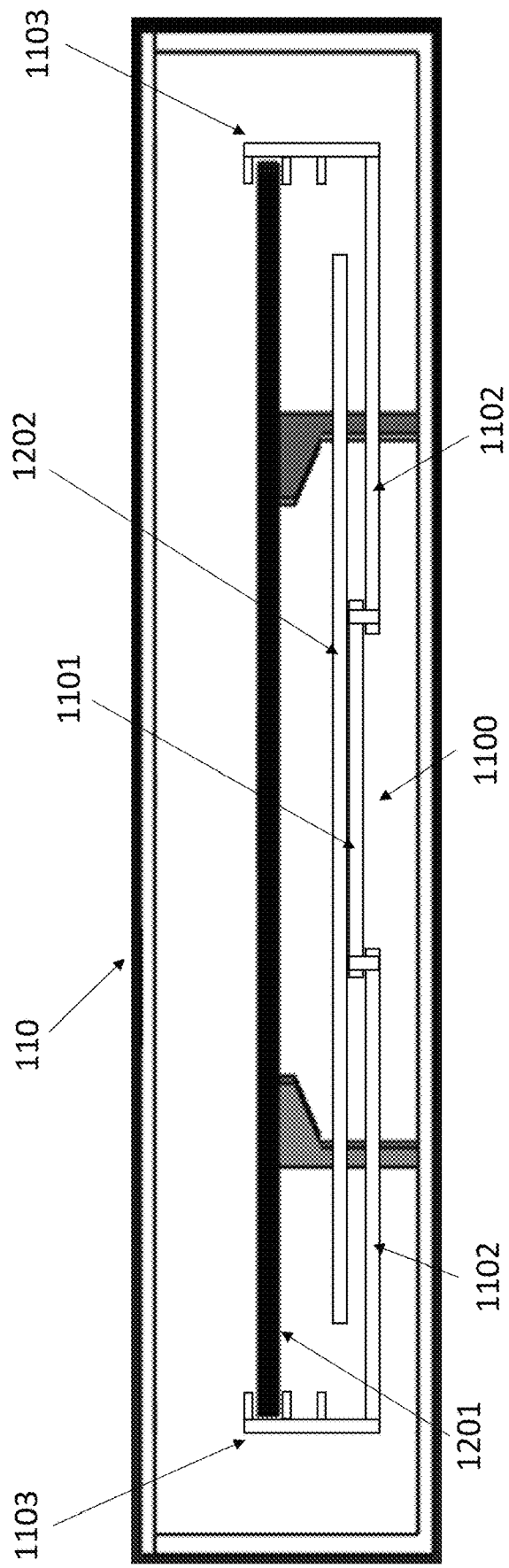
FIG. 7 is a cross-section view of the embodiment of a heat spreader attachment attached to a regularly shaped circuit board as illustrated in FIG. 3 within an electronic device disclosure, in an alternative spatial position compared to that illustrated in FIG. 6, along the y-cross section as shown in FIGS. 3 and 1.

FIG. 7 is a cross-section view of the embodiment of a heat spreader attachment 1100 attached to a regularly shaped circuit board 1201 as illustrated in FIG. 3 within an electronic device enclosure 110, in an alternative spatial position compared to that illustrated in FIG. 6, along the y-cross section as shown in FIGS. 3 and 1. References 1100, 1101, 1102, 1103, 1201, and 110 correspond to the heat spreader attachment, base plate, adjustable arms, plurality of circuit board hooks of the adjustment arms, circuit board, and the electronic device enclosure, respectively, as illustrated in FIG. 6. In the embodiment of FIG. 7, the circuit board 1201 is attached to an upper setting of the plurality of circuit board hooks 1103 on each of the adjustment arms 1102, thus demonstrating how the circuit board hooks 1103 are configured to adjust the spatial distance of the heat spreader 1202 to the desired location on, and spaced from, the circuit board 1201. As discussed above, in general, the closer the heat spreader 1202 is adjusted towards the circuit board 1201 and further away from the surface of the enclosure 110, the lower the surface temperature of the enclosure 110. And, in general, the further away from the circuit board 1201 the heat spreader 1202 is adjusted, towards the surface of the enclosure 110, the higher the surface temperature of the enclosure 110. As such, where the electronic device illustrated in FIG. 7 is the same as that illustrated in FIG. 6, the heat spreader 1202 configuration illustrated in FIG. 7—further away from circuit board 1201 and closer to the surface of the enclosure—will result in higher enclosure 110 surface temperatures during operation of the electronic device compared to the heat spreader 1202 configuration illustrated in FIG. 6.

Figure 8:
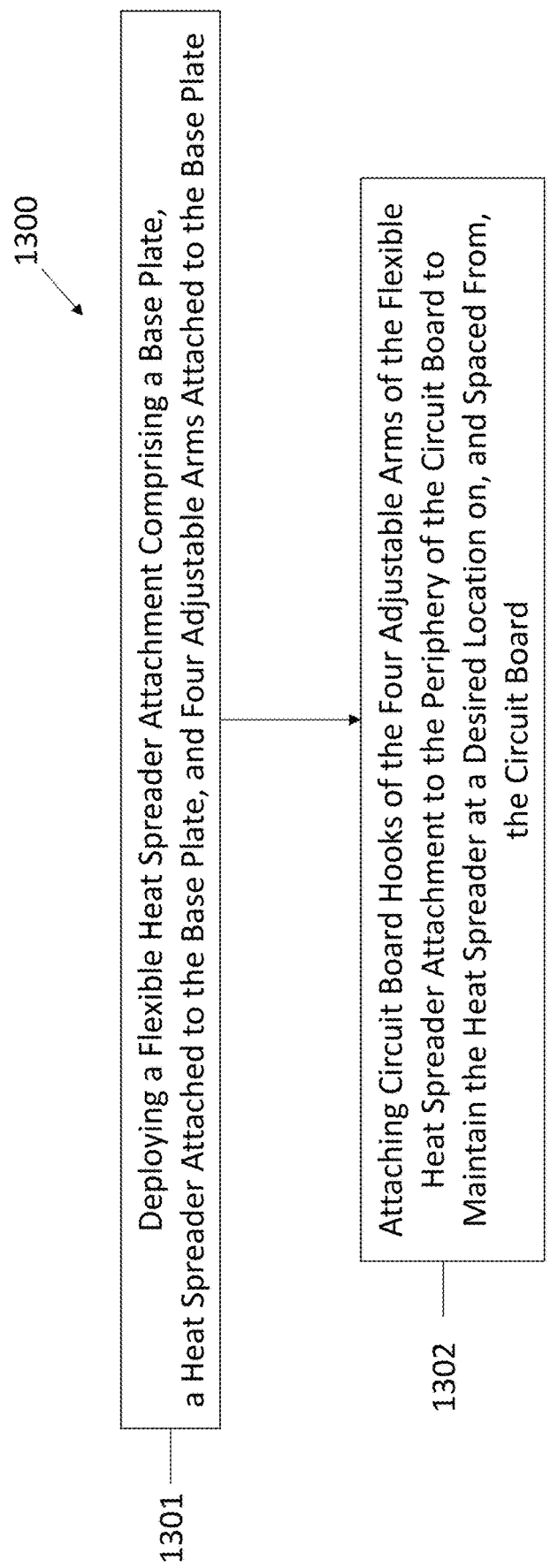
FIG. 8 is a flowchart illustrating an exemplary embodiment of a method of manufacturing an electronic device including a circuit board.

FIG. 8 is a flowchart 1300 illustrating an exemplary embodiment of a method of manufacturing an electronic device including a circuit board. In step 1301, a flexible heat spreader attachment consistent with the embodiments of the present disclosure is deployed with a base plate, a heat spreader attached to the base plate, and four adjustable arms attached to the base plate. In step 1302, circuit board hooks of the four adjustable arms of the flexible heat spreader attachment are attached to the periphery of the circuit board to maintain the heat spreader at a desired location on, and spaced from, the circuit board. During the step of attachment, in certain embodiments in which the heat spreader attachment includes a plurality of circuit board hooks, a setting placement is chosen depending on the specific heat mitigation desired during operation of the electronic device.

In connection with the embodiment of FIG. 8 the manufacturing and technical specifications of the electronic device may include specific requirements regarding surface temperature when the electronic device is in operation. As discussed above, placement of the heat spreader closer to circuit board and away from a surface of the enclosure will generally result in lower surface temperatures of the enclosure during operation of the electronic device. Conversely, placement of the heat spreader further away from the circuit board and towards the surface of the enclosure will generally result in higher surface temperatures of the enclosure during operation of the electronic device. As such, in embodiments with a plurality of circuit board hooks and therefore a plurality of attachment settings for the circuit board, surface temperatures may be mitigated and controlled by attaching a heat spreader attachment to a circuit board to a prescribed setting within the plurality of circuit board hooks on the adjustable arms of the heat spreader attachment in accordance with a manufacturing specification.

Additionally, the same heat spreader attachment described herein may be used during the manufacture of different electronic devices with differently shaped circuit boards, including circuit boards of irregular shapes and sizes, and electronic devices that may have different specific requirements regarding surface temperature when the electronic devices are in operation. The adjustability of the heat spreader attachment allows the same heat spreader attachment to be used in the manufacture of multiple different electronic devices, where the heat spreader is prescribed to be closer to a circuit board during manufacture of a first electronic device and the heat spreader is prescribed to be further away from a circuit board during manufacture of a second electronic device as compared to the prescription for the first electronic device. This avoids the expense and time of developing a customized heat spreader attachment for each electronic device. In other circumstances different customers of the same electronic device may have different temperature requirements, and the system and apparatus of the present disclosure allows an electronic device to be manufactured to the customer specification. For example, Customer A may have a surface temperature specification limited to 20-degrees Celsius above ambient temperature, while a second Customer B has a specification at 25-degrees Celsius above ambient temperature, for the same electronic device. With the presently disclosed heat spreader attachment, both electronic devices may be manufactured to within the customer specification using the same heat spreader attachment with its adjustability, in accordance with the embodiments disclosed herein. This avoids the expense and time of developing a customized heat spreader attachment for each customer implementation of the electronic device.

In an additional embodiment, a heat transfer apparatus and system for surface and component temperature mitigation for electronic devices such as set-top boxes with at least one circuit board is disclosed.

Figure 9:
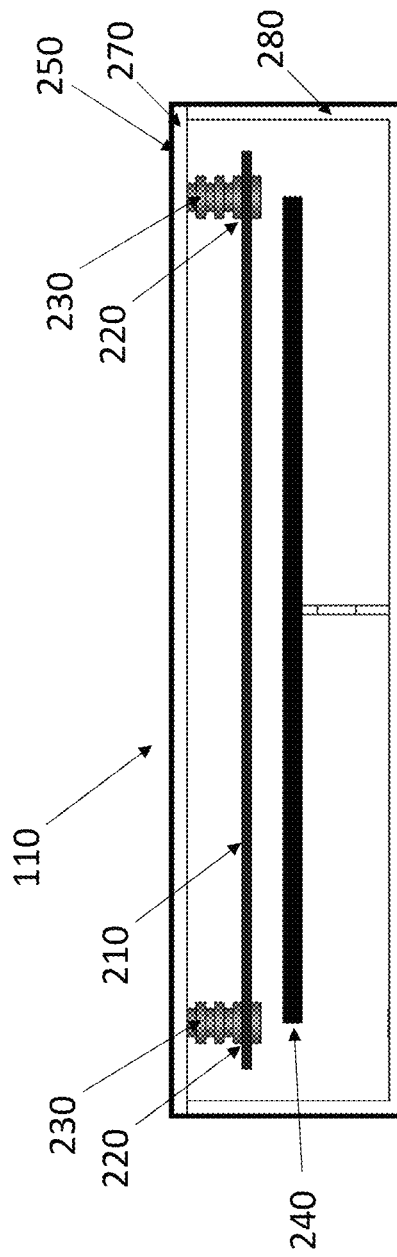
FIG. 9 is a cross-section view of an additional embodiment of an electronic device enclosure with a single heat spreader plate, along the x-cross section as shown in FIG. 1.

FIG. 9 is a cross-section view of an embodiment of an electronic device enclosure 110 with a single heat spreader plate 210, along the x-cross section as shown in FIG. 1. The enclosure 110 includes an upper surface 250 of the upper portion 270 and a lower surface 260 of the lower portion 280. Within the enclosure 110 is at least one circuit board 240 that emits heat during operation of the electronic device. The enclosure 110 also includes a single heat spreader plate 210 that spreads heat emitted by the circuit board 240 to reduce the surface temperature of the enclosure 110. The heat spreader plate 210 may also reduce component temperatures of the circuit board 240. The heat spreader plate 210 includes at least two adjustment holes 220 configured to receive ribbed post 230 of the enclosure 110. The heat spreader plate 210 is adjustable along lengths of least two ribbed posts 230 of the enclosure 110 relative to the circuit board 240 to reduce the surface temperature of the enclosure 110. In certain embodiments, the ribbed posts 230 are flexible enough to allow a smooth transition of the heat spreader plate 210 along the posts, but rigid enough to hold the heat spreader plate 210 in place. In general, the closer the heat spreader 210 is adjusted towards the circuit board 240 and further away from the upper surface of the enclosure 250, the lower the surface temperature of the enclosure 110. And, in general, the further away from the circuit board 240 the heat spreader 210 is adjusted, towards the upper surface of the enclosure 250, the higher the surface temperature of the enclosure 110.

Figure 10:
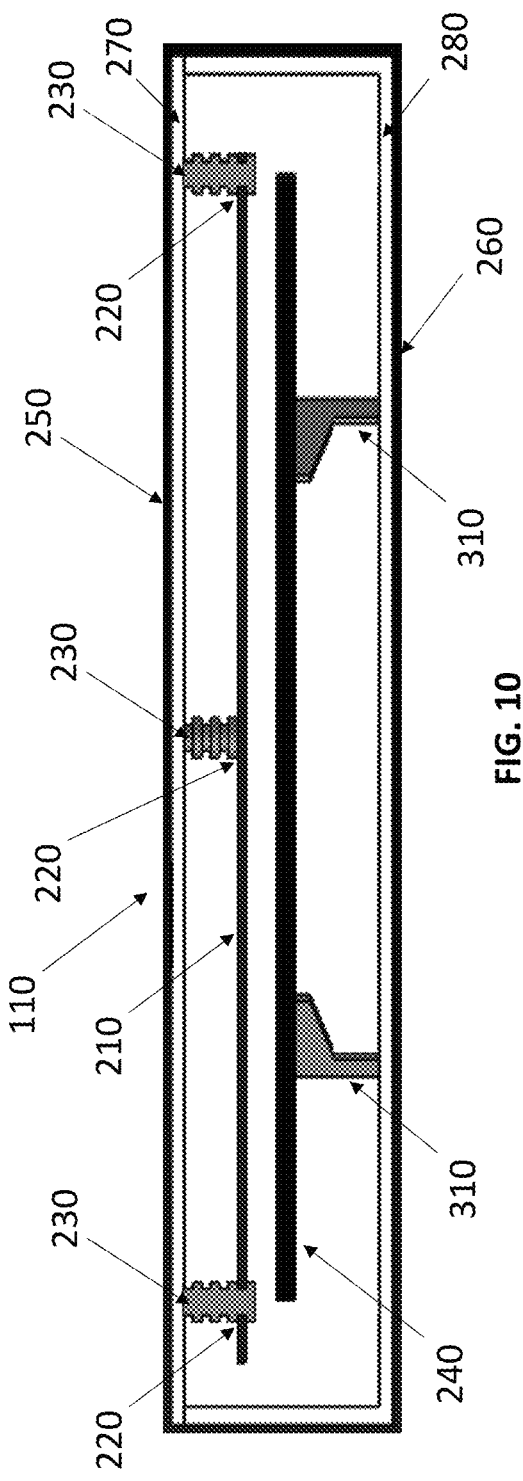
FIG. 10 is a cross-section view of an embodiment of an electronic device enclosure with a single heat spreader plate as illustrated in FIG. 9, along the y-cross section as shown in FIG. 1.

FIG. 10 is a cross-section view of an embodiment of an electronic device enclosure 110 with a single heat spreader plate 210, along the y-cross section as shown in FIG. 1. References 110, 210, 240, 250, 260, 270, and 280 correspond to the enclosure, heat spreader plate, circuit board, and upper and lower surfaces of the enclosure, and upper and lower portions of the enclosure, respectively, as illustrated in FIG. 9. In the y-cross section view, FIG. 10 illustrates an additional ribbed post 230 in the center of the figure corresponding to a third ribbed post 230 in a corner of enclosure 110, as well as a third adjustment hole 220 of the heat spreader plate 210. In the embodiment of FIG. 10, there are four adjustment holes 220 at each of four corners of the heat spreader plate 210 that receive four ribbed posts 230 at each of four corners of the enclosure 110. In FIG. 10, the fourth ribbed post 230 and fourth adjustment hole 220 are not illustrated. In certain embodiments, the enclosure 110 may include supports 310 to support the circuit board 240, as illustrated in FIG. 10.

Figure 11:
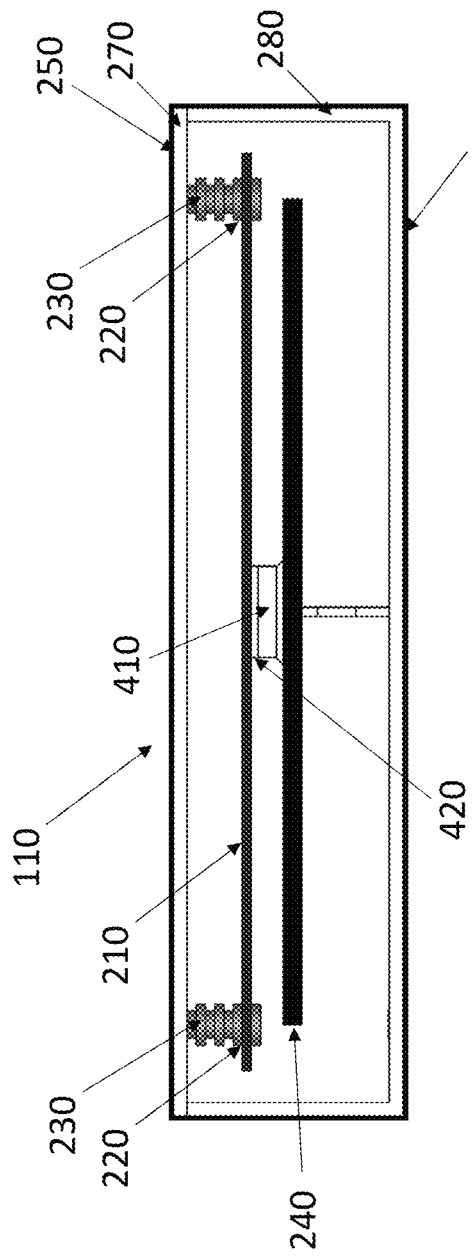
FIG. 11 is a cross-section view of an embodiment of an electronic device enclosure with a single heat spreader plate thermally interfacing with a semiconductor element, along the x-cross section as shown in FIG. 1.

FIG. 11 is a cross-section view of an embodiment of an electronic device enclosure 110 with a single heat spreader plate 210 thermally interfacing with a semiconductor element 410, along the x-cross section as shown in FIG. 1. FIG. 11 differs from FIG. 9 in that the heat spreader plate 210 is thermally interfacing with a semiconductor element 410 of the circuit board 240 through a thermal interface 420. In the illustrated embodiment of FIG. 11, the heat spreader plate 210 spreads heat emitted by semiconductor element 410 transferred to the heat spreader plate 210 in-part through thermal interface 420. In some embodiments, the thermal interface 420 may be a thermal interface material such as thermal paste, thermal adhesive, a thermally conductive pad, or thermal tape. In some embodiments, the semiconductor element 410 is an integrated circuit element such as a memory, a microcontroller, a microprocessor, programmable logic array, or an application-specific integrated circuit. In some embodiments, the semiconductor element 410 is a main processor of the circuit board 240.

Figure 12:
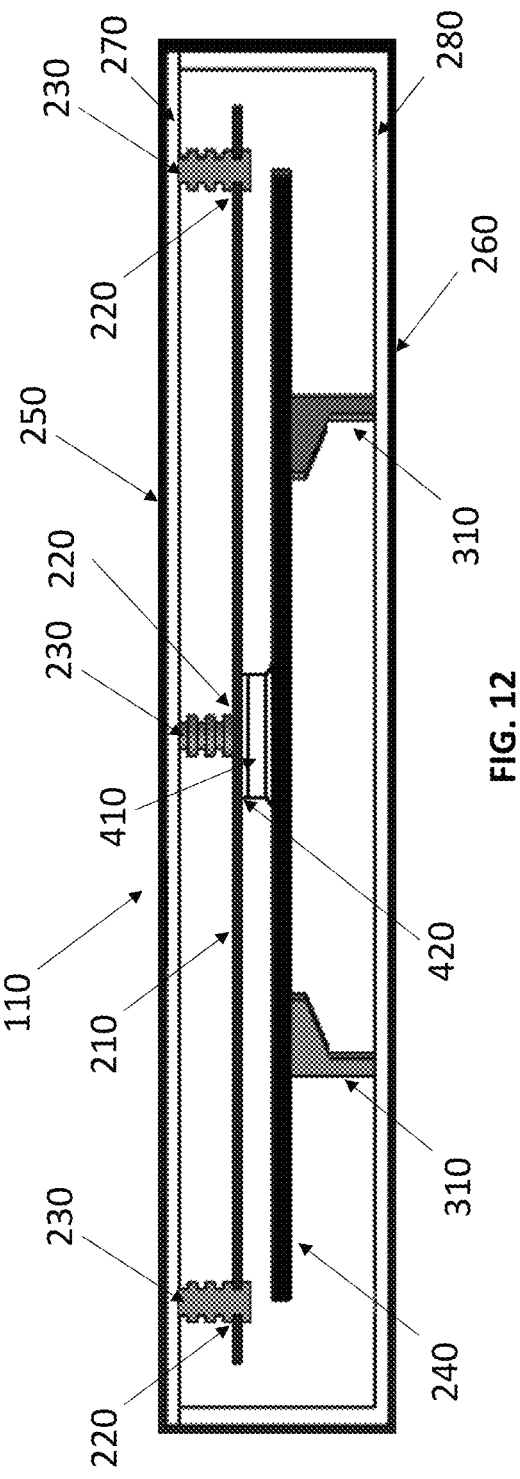
FIG. 12 is a cross-section view of an embodiment of an electronic device enclosure with a single heat spreader plate thermally interfacing with a semiconductor element as illustrated in FIG. 11, along the y-cross section as shown in FIG. 1.

FIG. 12 is a cross-section view of an embodiment of an electronic device enclosure 110 with a single heat spreader plate 210 thermally interfacing with a semiconductor element 410 as illustrated in FIG. 11, along the y-cross section as shown in FIG. 1. References 110, 210, 240, 250, 260, 270, 280, 410, and 420 correspond to the enclosure, heat spreader plate, circuit board, upper and lower surfaces of the enclosure, upper and lower portions of the enclosure, semiconductor element, and thermal interface, respectively, as illustrated in FIG. 11. In the y-cross section view, FIG. 12 illustrates an additional ribbed post 230 in the center of the figure corresponding to a third ribbed post 230 in a corner of enclosure 110, as well as a third adjustment hole 220 of the heat spreader plate 210. In the embodiment of FIG. 12, there are four adjustment holes 220 at each of four corners of the heat spreader plate 210 that receive four ribbed posts 230 at each of four corners of the enclosure 110. In FIG. 12, the fourth ribbed post 230 and fourth adjustment hole 220 are not illustrated. In certain embodiments, the enclosure 110 may include supports 310 to support the circuit board 240, as illustrated in FIG. 12.

Figure 13:
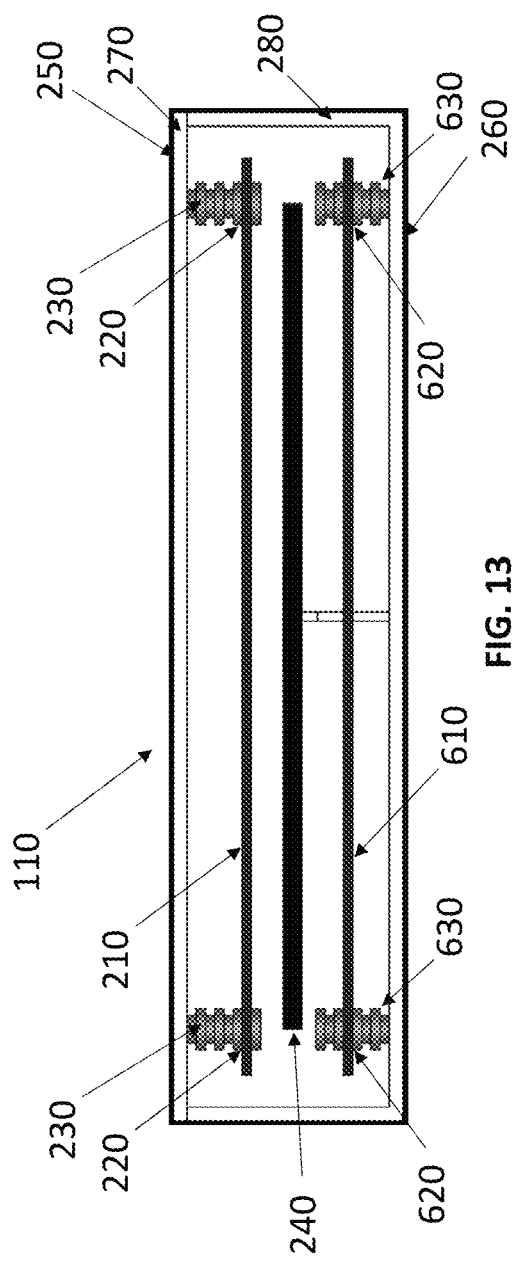
FIG. 13 is a cross-section view of an embodiment of an electronic device enclosure with two heat spreader plates, along the x-cross section as shown in FIG. 1.

FIG. 13 is a cross-section view of an embodiment of an electronic device enclosure 110 with two heat spreader plates (210, 610), along the x-cross section as shown in FIG. 1. FIG. 13 differs from FIG. 9 in that there is a second heat spreader plate 610 below circuit board 240, while heat spreader plate 210 is above circuit board 240 just as in FIG. 9. In the embodiment of FIG. 13, the second heat spreader plate 610 spreads heat emitted by the circuit board 240 to reduce the surface temperature of the enclosure 110. The heat spreader plate 610 may also reduce component temperatures of the circuit board 240. The heat spreader plate 610 includes at least two adjustment holes 620 configured to receive ribbed post 630 of the enclosure 110. The heat spreader plate 610 is adjustable along lengths of least two ribbed posts 630 of the enclosure 110 relative to the circuit board 240 to reduce the surface temperature of the enclosure 110. In general, the closer the heat spreader 610 is adjusted towards the circuit board 240 and further away from the lower surface of the enclosure 260, the lower the surface temperature of the enclosure 110. And, in general, the further away from the circuit board 240 the heat spreader 610 is adjusted, towards the lower surface of the enclosure 260, the higher the surface temperature of the enclosure 110. As illustrated in the embodiment of FIG. 13, adjustment of the heat spreader plate 210 is relative to the circuit board 240 from above the circuit board 240, and adjustment of the second heat spreader plate 610 is relative to the circuit board from below the circuit board 240.

Figure 14:
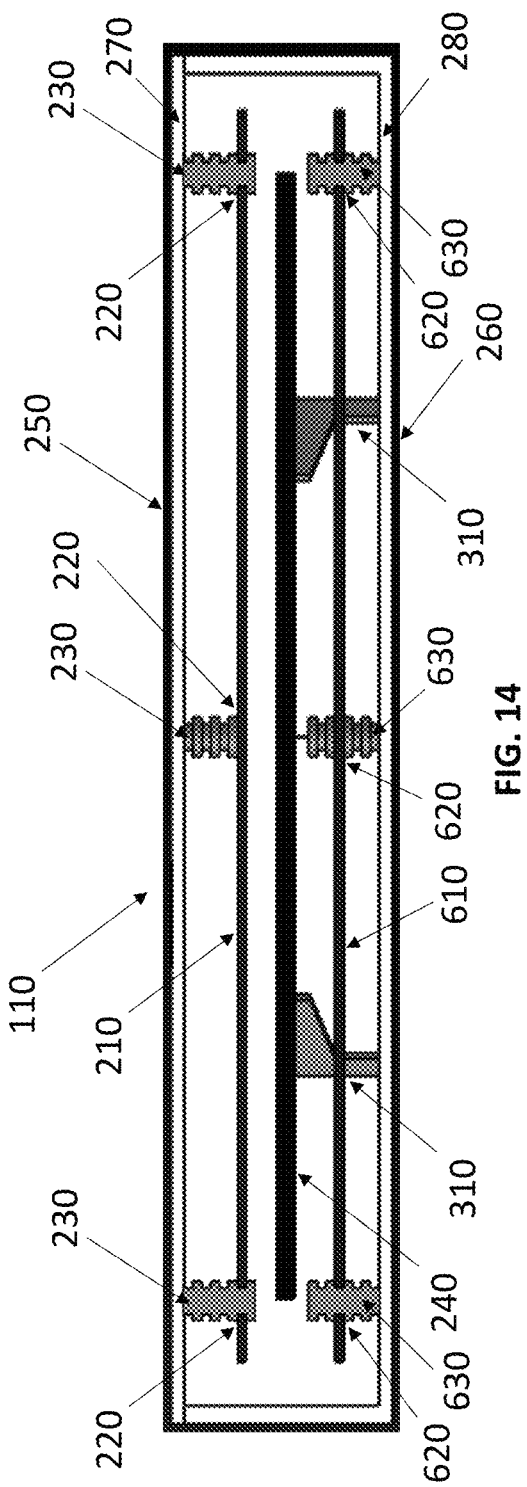
FIG. 14 is a cross-section view of an embodiment of an electronic device enclosure with two heat spreader plates as illustrated in FIG. 13, along the y-cross section as shown in FIG. 1.

FIG. 14 is a cross-section view of an embodiment of an electronic device enclosure with two heat spreader plates as illustrated in FIG. 13, along the y-cross section as shown in FIG. 1. References 110, 210, 240, 250, 260, 270, 280, and 610 correspond to the enclosure, heat spreader plate, circuit board, upper and lower surfaces of the enclosure, upper and lower portions of the enclosure, and second heat spreader, respectively, as illustrated in FIG. 13. In the y-cross section view, FIG. 14 illustrates an additional ribbed post 230 and an additional adjustment hole 220 of the heat spreader plate 210 in the center of the figure, as well as an additional ribbed post 630 in the center and an additional adjustment hole 620 of the second heat spreader 610 in the center of the figure. In the embodiment of FIG. 14, there are four adjustment holes 220 at each of four corners of the heat spreader plate 210 that receive four ribbed posts 230 at each of four corners of the upper portion 270 of enclosure 110, and there are four adjustment holes 620 at each of four corners of the heat spreader plate 610 that receive four ribbed posts 630 at each of four corners of the lower portion 280 of enclosure 110. In FIG. 14, the fourth ribbed post 230, fourth adjustment hole 220, fourth ribbed post 630, and fourth adjustment hole 620 are not illustrated. In certain embodiments of the present disclosure, the enclosure 110 may include supports 310 to support the circuit board 240, as illustrated in FIG. 14.

FIG. 15 is a cross-section view of an embodiment of an electronic device enclosure 110 with two heat spreader plates (210, 610), with one heat spreader plate 210 thermally interfacing with a semiconductor element 410, along the x-cross section as shown in FIG. 1. FIG. 15 differs from FIG. 13 in that the heat spreader plate 210 is thermally interfacing with a semiconductor element 410 of the circuit board 240 through a thermal interface 420. In the illustrated embodiment of FIG. 15, the heat spreader plate 210 spreads heat emitted by semiconductor element 410 transferred to the heat spreader plate 210 in-part through thermal interface 420. In some embodiments, the thermal interface 420 may be a thermal interface material such as thermal paste, thermal adhesive, a thermally conductive pad, or thermal tape. In some embodiments, the semiconductor element 410 is an integrated circuit element such as a memory, a microcontroller, a microprocessor, programmable logic array, or an application-specific integrated circuit. In some embodiments, the semiconductor element 410 is a main processor of the circuit board 240.

FIG. 16 is a cross-section view of an embodiment of an electronic device enclosure 110 with two heat spreader plates (210, 610), with one heat spreader plate 210 thermally interfacing with a semiconductor element 410 as illustrated in FIG. 15, along the y-cross section as shown in FIG. 1. References 110, 210, 240, 250, 260, 270, 280, and 610 correspond to the enclosure, heat spreader plate, circuit board, upper and lower surfaces of the enclosure, upper and lower portions of the enclosure and second heat spreader, respectively, as illustrated in FIG. 15. In the y-cross section view, FIG. 16 illustrates an additional ribbed post 230 and an additional adjustment hole 220 of the heat spreader plate 210 in the center of the figure, as well as an additional ribbed post 630 and an additional adjustment hole 620 of the second heat spreader 610 in the center of the figure. In the embodiment of FIG. 16, there are four adjustment holes 220 at each of four corners of the heat spreader plate 210 that receive four ribbed posts 230 at each of four corners of the upper portion 270 of enclosure 110, and there are four adjustment holes 620 at each of four corners of the heat spreader plate 610 that receive four ribbed posts 630 at each of four corners of the lower portion 280 of enclosure 110. In FIG. 16, the fourth ribbed post 230, fourth adjustment hole 220, fourth ribbed post 630, and fourth adjustment hole 620 are not illustrated. In certain embodiments of the present disclosure, the enclosure 110 may include supports 310 to support the circuit board 240, as illustrated in FIG. 16.

Figure 17:
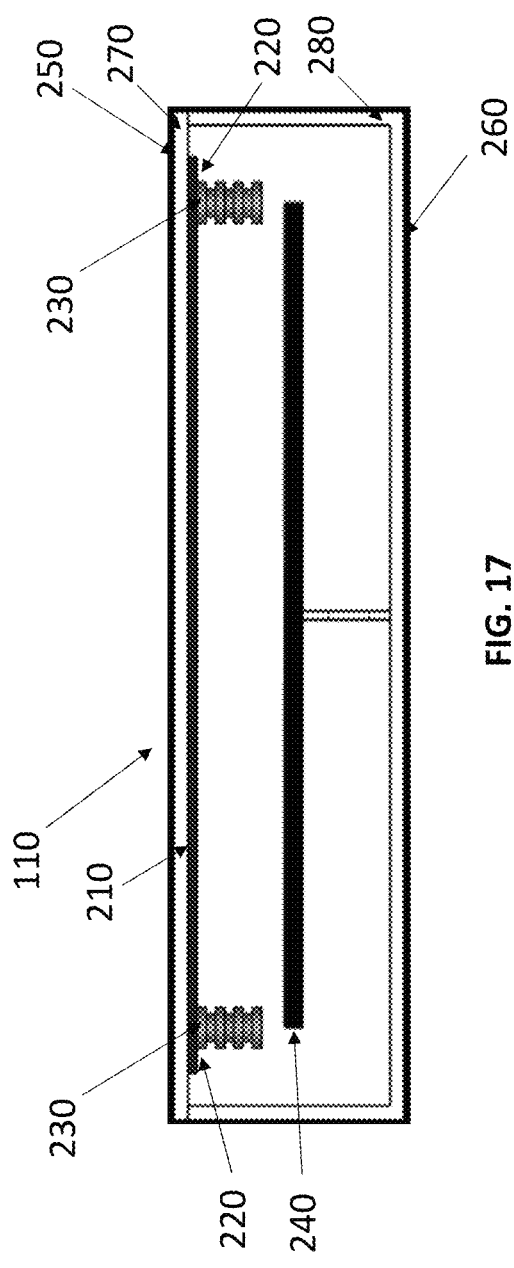
FIG. 17 is a cross-section view of an embodiment of an electronic device enclosure with a single heat spreader plate adjusted towards the upper surface of the enclosure, along the x-cross section as shown in FIG. 1.

FIG. 17 is a cross-section view of an embodiment of an electronic device enclosure with a single heat spreader plate 210 adjusted towards the upper surface of the enclosure 250, along the x-cross section as shown in FIG. 1. FIG. 17 differs from FIG. 9 in that heat spreader plate 210 is adjusted along ribbed posts 230 to the closest setting to the upper surface 250 of enclosure 110, and furthest away from circuit board 240. As discussed above, heat spreader plate 210 spreads heat emitted by the circuit board 240 to reduce the surface temperature of the enclosure 110. The heat spreader plate 210 may also reduce component temperatures of the circuit board 240. In general, the closer the heat spreader 210 is adjusted towards the circuit board 240 and further away from the upper surface of the enclosure 250, the lower the surface temperature of the enclosure 110. And, in general, the further away from the circuit board 240 the heat spreader 210 is adjusted, towards the upper surface of the enclosure 250, the higher the surface temperature of the enclosure 110. As such where the electronic device illustrated in FIG. 17 is the same as that illustrated in FIG. 9, the heat spreader plate 210 configuration illustrated in FIG. 17—further away from circuit board 240 and closer to the upper surface 250—will result in higher enclosure 110 surfaces temperatures during operation of the electronic device compared to the heat spreader 210 configuration illustrated in FIG. 9.

Figure 18:
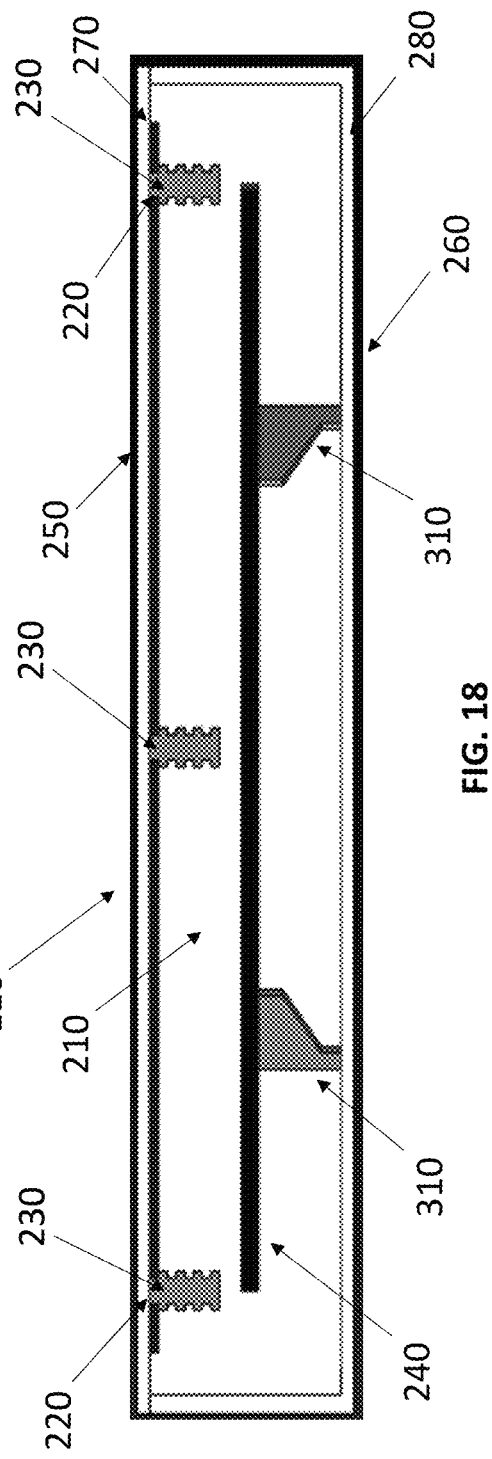
FIG. 18 is a cross-section view of an embodiment of an electronic device enclosure with a single heat spreader plate adjusted towards the upper surface of the enclosure as illustrated in FIG. 17, along the y-cross section as shown in FIG. 1.

FIG. 18 is a cross-section view of an embodiment of an electronic device enclosure 110 with a single heat spreader plate 210 adjusted towards the upper surface of the enclosure 250 as illustrated in FIG. 17 along the y-cross section as shown in FIG. 1. References 110, 210, 240, 250, 260, 270, and 280 correspond to the enclosure, heat spreader plate, circuit board, upper and lower surfaces of the enclosure, upper and lower portions of the enclosure, respectively, as illustrated in FIG. 17. In the y-cross section view, FIG. 18 illustrates an additional ribbed post 230 in the center of the figure corresponding to a third ribbed post 230 in a corner of enclosure 110, as well as a third adjustment hole 220 of the heat spreader plate 210. In the embodiment of FIG. 18, there are four adjustment holes 220 at each of four corners of the heat spreader plate 210 that receive four ribbed posts 230 at each of four corners of the enclosure 110. In FIG. 18, the fourth ribbed post 230 and fourth adjustment hole 220 are not illustrated. In certain embodiments, the enclosure 110 may include supports 310 to support the circuit board 240, as illustrated in FIG. 18.

Figure 19:
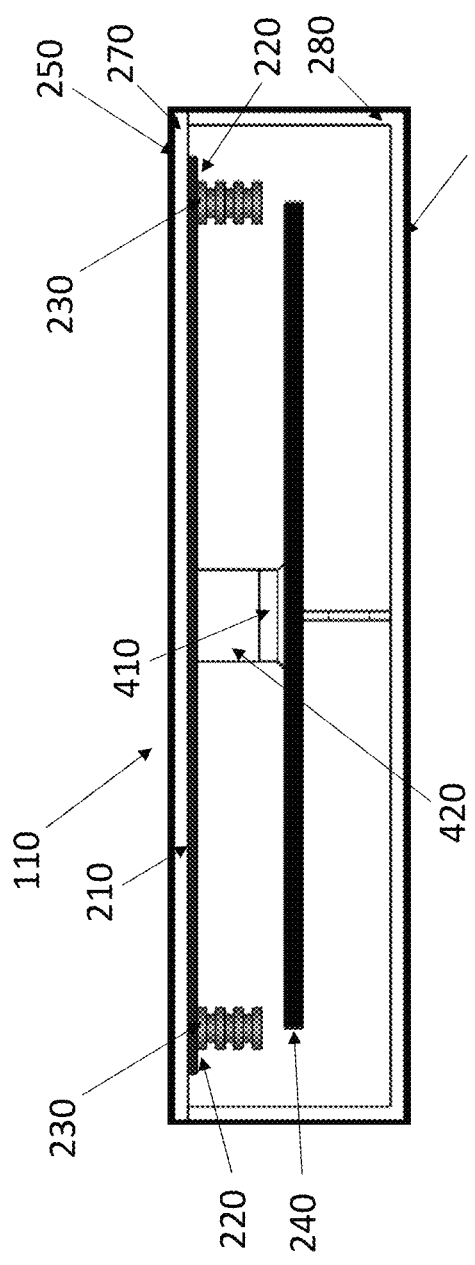
FIG. 19 is a cross-section view of an embodiment of an electronic device enclosure with a single heat spreader plate adjusted towards the upper surface of the enclosure and thermally interfacing with a semiconductor element, along the x-cross section as shown in FIG. 1.

FIG. 19 is a cross-section view of an embodiment of an electronic device enclosure 110 with a single heat spreader plate 210 adjusted towards the upper surface of the enclosure 250 thermally interfacing with a semiconductor element 410, along the x-cross section as shown in FIG. 1. FIG. 19 differs from FIG. 17 in that the heat spreader plate 210 is thermally interfacing with a semiconductor element 410 of the circuit board 240 through a thermal interface 420. In the illustrated embodiment of FIG. 19, the heat spreader plate 210 spreads heat emitted by semiconductor element 410 transferred to the heat spreader plate 210 in-part through thermal interface 420. In some embodiments, the thermal interface 420 may be a thermal interface material such as thermal paste, thermal adhesive, a thermally conductive pad, or thermal tape. In some embodiments, the semiconductor element 410 is an integrated circuit element such as a memory, a microcontroller, a microprocessor, programmable logic array, or an application-specific integrated circuit. In some embodiments, the semiconductor element 410 is a main processor of the circuit board 240.

Figure 20:
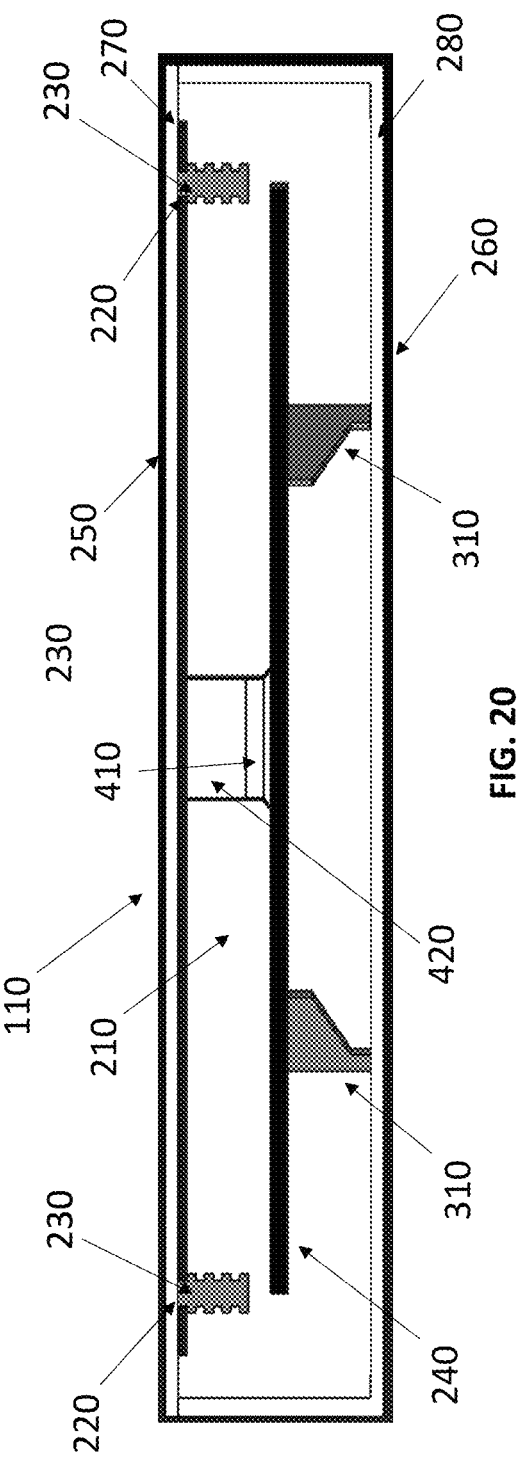
FIG. 20 is a cross-section view of an embodiment of an electronic device enclosure with a single heat spreader plate adjusted towards the upper surface of the enclosure and thermally interfacing with a semiconductor element as illustrated in FIG. 19, along the y-cross section as shown in FIG. 1.

FIG. 20 is a cross-section view of an embodiment of an electronic device enclosure 110 with a single heat spreader plate 210 thermally interfacing with a semiconductor element 410 as illustrated in FIG. 19, along the y-cross section as shown in FIG. 1. References 110, 210, 240, 250, 260, 270, 280, 410, and 420 correspond to the enclosure, heat spreader plate, circuit board, upper and lower surfaces of the enclosure, upper and lower portions of the enclosure, semiconductor element, and thermal interface, respectively, as illustrated in FIG. 19. In the embodiment of FIG. 20, there are four adjustment holes 220 at each of four corners of the heat spreader plate 210 that receive four ribbed posts 230 at each of four corners of the enclosure 110. In FIG. 20, the third and fourth ribbed post 230 and third and fourth adjustment hole 220 are not illustrated. In certain embodiments, the enclosure 110 may include supports 310 to support the circuit board 240, as illustrated in FIG. 20.

Figure 21:
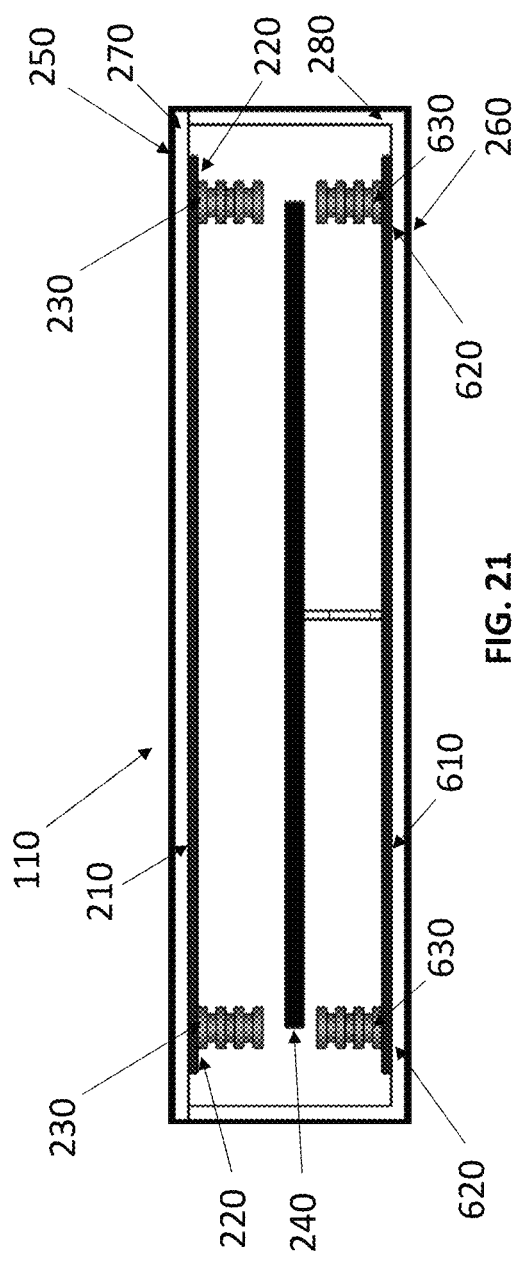
FIG. 21 is a cross-section view of an embodiment of an electronic device enclosure with two heat spreader plates adjusted towards the upper and lower surfaces of the enclosure, along the x-cross section as shown in FIG. 1.

FIG. 21 is a cross-section view of an embodiment of an electronic device enclosure 110 with two heat spreader plates (210, 610), along the x-cross section as shown in FIG. 1. FIG. 21 differs from FIG. 17 in that there is a second heat spreader plate 610 below circuit board 240, while heat spreader plate 210 is above circuit board 240 just as in FIG. 17. FIG. 21 differs from FIG. 13 in that heat spreader plate 210 is adjusted along ribbed posts 230 to the closest setting to the upper surface 250 of enclosure 110 and furthest away from circuit board 240, and the second heat spreader plate 610 is adjusted along ribbed posts 230 to the closest setting to lower surface 260 of enclosure 110 and furthest away from circuit board 240. In the embodiment of FIG. 21, the second heat spreader plate 610 spreads heat emitted by the circuit board 240 to reduce the surface temperature of the enclosure 110. The heat spreader plate 610 may also reduce component temperatures of the circuit board 240. The heat spreader plate 610 includes at least two adjustment holes 620 configured to receive ribbed post 630 of the enclosure 110. The heat spreader plate 610 is adjustable along lengths of least two ribbed posts 630 of the enclosure 110 relative to the circuit board 240 to reduce the surface temperature of the enclosure 110. In general, the closer the heat spreader 610 is adjusted towards the circuit board 240 and further away from the lower surface of the enclosure 260, the lower the surface temperature of the enclosure 110. And, the further away from the circuit board 240 the heat spreader 610 is adjusted, towards the lower surface of the enclosure 260, the higher the surface temperature of the enclosure 110. As illustrated in the embodiment of FIG. 21, adjustment of the heat spreader plate 210 is relative to the circuit board 240 from above the circuit board 240, and adjustment of the second heat spreader plate 610 is relative to the circuit board from below the circuit board 240. As such where the electronic device illustrated in FIG. 21 is the same as that illustrated in FIG. 13, the heat spreader plate 210 and second heat spreader plate 610 configuration illustrated in FIG. 21—both further away from the circuit board 240 and closer to the upper and lower surfaces (250, 260)—will result in higher enclosure 110 surfaces temperatures during operation of the electronic device compared to the heat spreader 210 and second heat spreader 610 configuration illustrated in FIG. 13 As illustrated in FIGS. 13 and 17, there are a total of four ribs on each ribbed post, and therefore a total of sixteen different position configuration combinations for the heat spreader 210 and second heat spreader 610, providing significant ability to tune the heat control of the disclosed heat transfer apparatus during operation of the electronic device in which the heat transfer apparatus is implemented in its enclosure.

Figure 22:
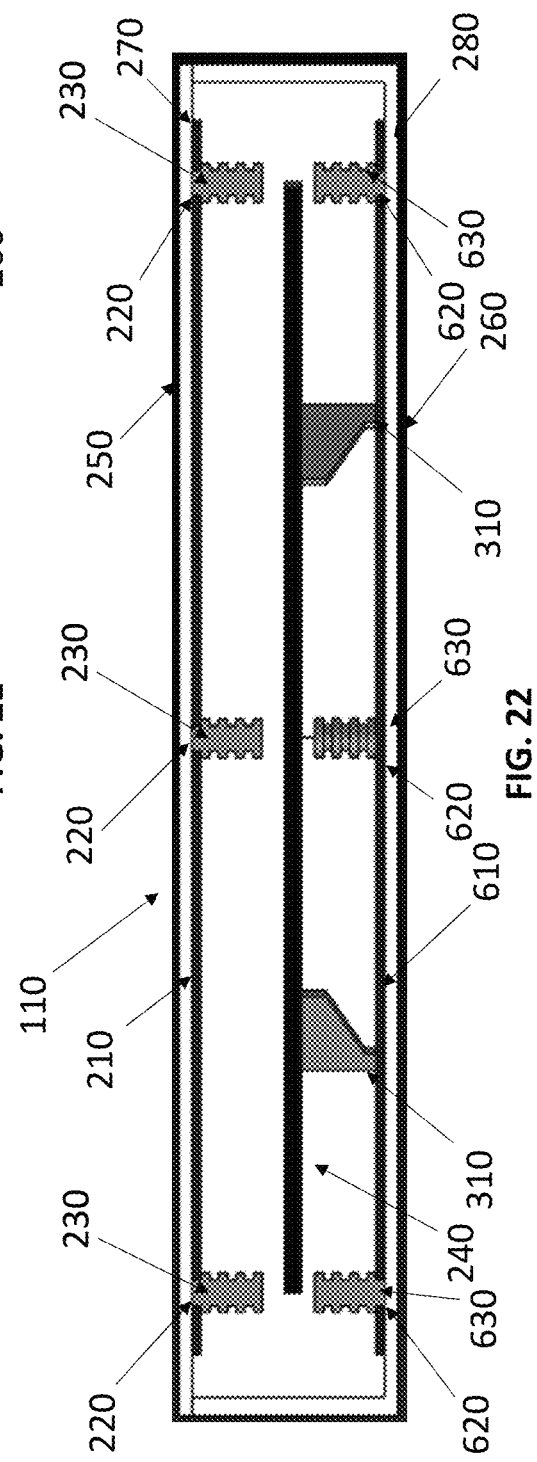
FIG. 22 is a cross-section view of an embodiment of an electronic device enclosure with two heat spreader plates adjusted towards the upper and lower surfaces of the enclosure as illustrated in FIG. 21, along the y-cross section as shown in FIG. 1.

FIG. 22 is a cross-section view of an embodiment of an electronic device enclosure 110 with two heat spreader plates (210, 610) as illustrated in FIG. 21, along the y-cross section as shown in FIG. 1. References 110, 210, 240, 250, 260, 270, 280 and 610 correspond to the enclosure, heat spreader plate, circuit board, upper and lower surfaces of the enclosure, upper and lower portions of the enclosure, and second heat spreader, respectively, as illustrated in FIG. 21. In the y-cross section view, FIG. 22 illustrates an additional ribbed post 230 and an additional adjustment hole 220 of the heat spreader plate 210 in the center of the figure, as well as an additional ribbed post 630 and an additional adjustment hole 620 of the second heat spreader 610 in the center of the figure. In the embodiment of FIG. 22, there are four adjustment holes 220 at each of four corners of the heat spreader plate 210 that receive four ribbed posts 230 at each of four corners of the upper portion 270 of enclosure 110, and there are four adjustment holes 620 at each of four corners of the heat spreader plate 610 that receive four ribbed posts 630 at each of four corners of the lower portion 280 of enclosure 110. In FIG. 22, the fourth ribbed post 230, fourth adjustment hole 220, fourth ribbed post 630, and fourth adjustment hole 620 are not illustrated. In certain embodiments of the present disclosure, the enclosure 110 may include supports 310 to support the circuit board 240, as illustrated in FIG. 22.

Figure 23:
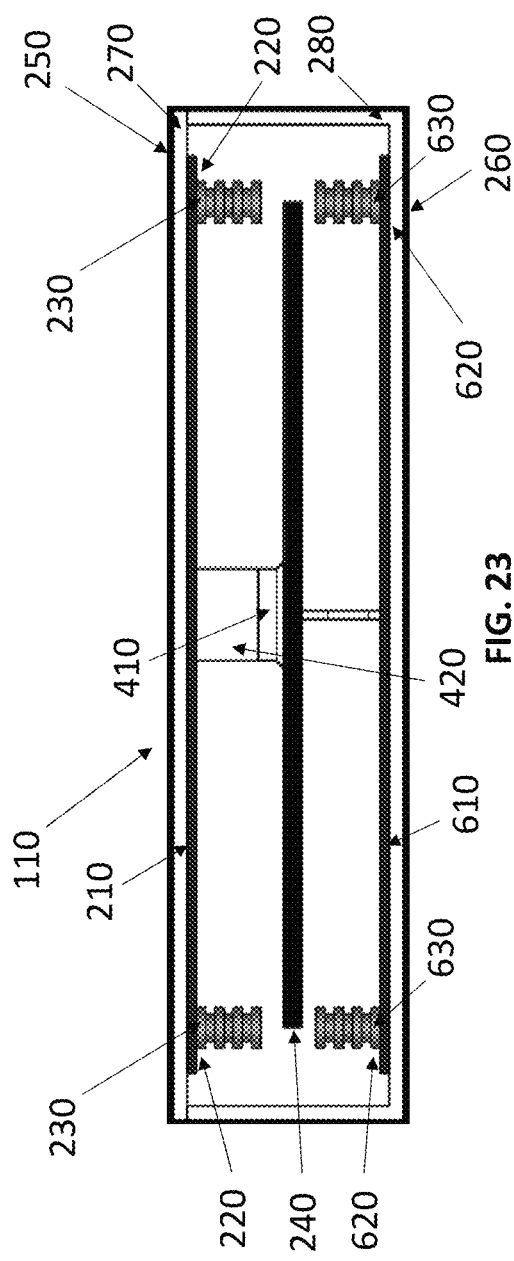
FIG. 23 is a cross-section view of an embodiment of an electronic device enclosure with two heat spreader plates adjusted towards the upper and lower surfaces of the enclosure, with one heat spreader plate thermally interfacing with a semiconductor element, along the x-cross section as shown in FIG. 1.

FIG. 23 is a cross-section view of an embodiment of an electronic device enclosure 110 with two heat spreader plates (210, 610), with one heat spreader plate 210 thermally interfacing with a semiconductor element 410, along the x-cross section as shown in FIG. 1. FIG. 23 differs from FIG. 21 in that the heat spreader plate 210 is thermally interfacing with a semiconductor element 410 of the circuit board 240 through a thermal interface 420. In the illustrated embodiment of FIG. 23, the heat spreader plate 210 spreads heat emitted by semiconductor element 410 transferred to the heat spreader plate 210 in-part through thermal interface 420. In some embodiments, the thermal interface 420 may be a thermal interface material such as thermal paste, thermal adhesive, a thermally conductive pad, or thermal tape. In some embodiments, the semiconductor element 410 is an integrated circuit element such as a memory, a microcontroller, a microprocessor, programmable logic array, or an application-specific integrated circuit. In some embodiments, the semiconductor element 410 is a main processor of the circuit board 240.

Figure 24:
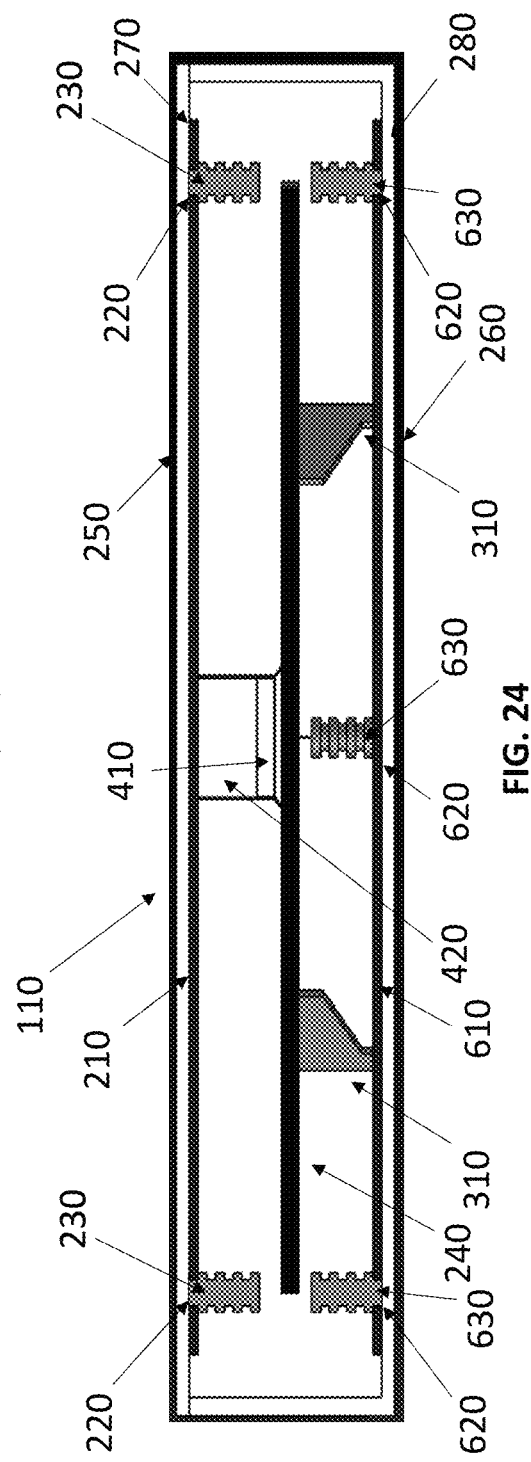
FIG. 24 is a cross-section view of an embodiment of an electronic device enclosure with two heat spreader plates adjusted towards the upper and lower surfaces of the enclosure, with one heat spreader plate thermally interfacing with a semiconductor element as illustrated in FIG. 23, along the y-cross section as shown in FIG. 1.

FIG. 24 is a cross-section view of an embodiment of an electronic device enclosure 110 with two heat spreader plates (210, 610), with one heat spreader plate 210 thermally interfacing with a semiconductor element 240 as illustrated in FIG. 23, along the y-cross section as shown in FIG. 1. References 110, 210, 240, 250, 260, 270, 280, and 610 correspond to the enclosure, heat spreader plate, circuit board, upper and lower surfaces of the enclosure, upper and lower portions of the enclosure, and second heat spreader, respectively, as illustrated in FIG. 23. In the y-cross section view, FIG. 24 illustrates an additional ribbed post 630 and an additional adjustment hole 620 of the second heat spreader 610 in the center of the figure. In the embodiment of FIG. 24, there are four adjustment holes 220 at each of four corners of the heat spreader plate 210 that receive four ribbed posts 230 at each of four corners of the upper portion 270 of enclosure 110, and there are four adjustment holes 620 at each of four corners of the heat spreader plate 610 that receive four ribbed posts 630 at each of four corners of the lower portion 280 of enclosure 110. In FIG. 24, the third and fourth ribbed post 230, third and fourth adjustment hole 220, fourth ribbed post 630, and fourth adjustment hole 620 are not illustrated. In certain embodiments of the present disclosure, the enclosure 110 may include supports 310 to support the circuit board 240, as illustrated in FIG. 24.

Figure 25:
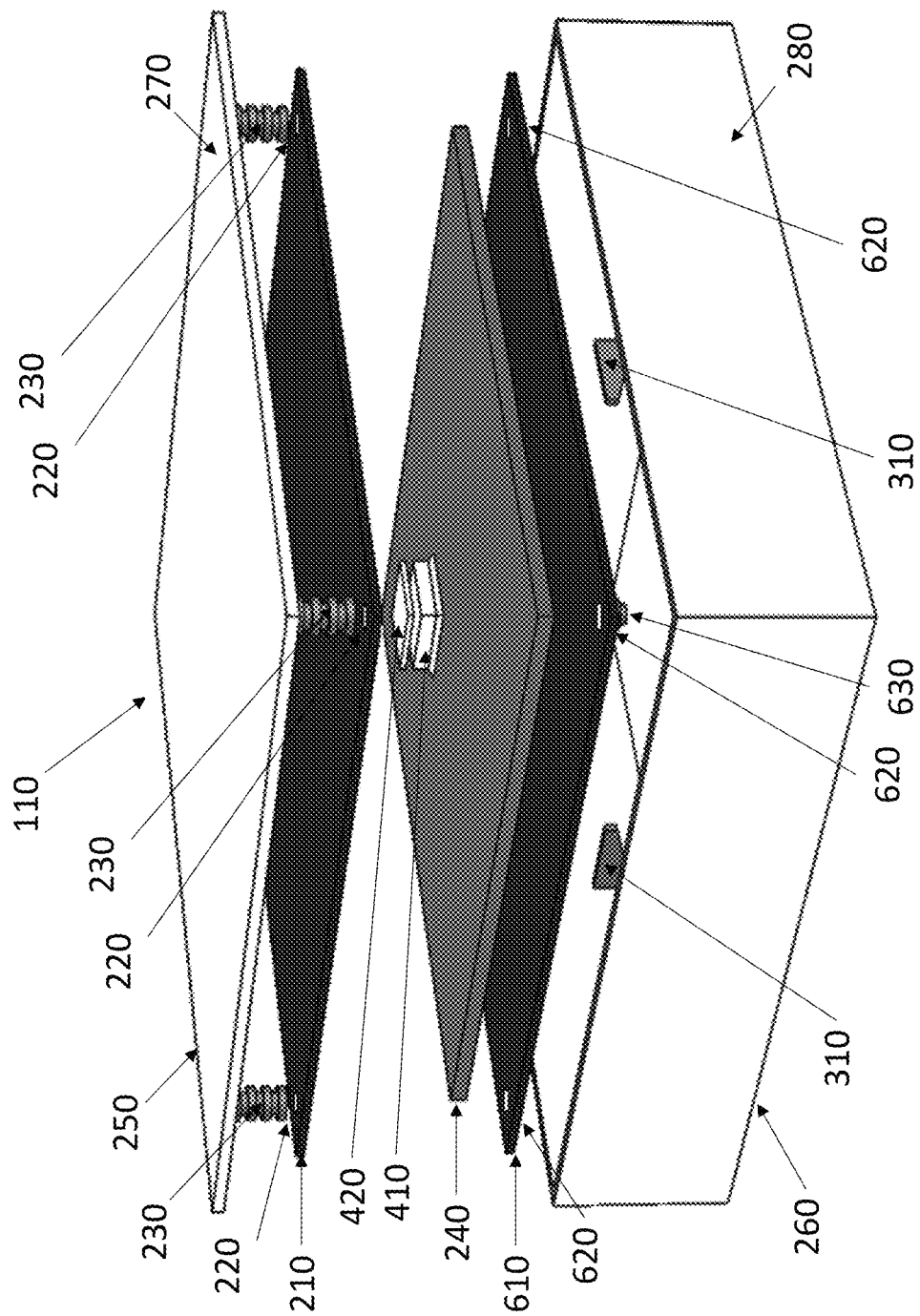
FIG. 25 is an exploded view of an embodiment of an electronic device enclosure prior to assembly.

FIG. 25 is an exploded view of an embodiment of an electronic device enclosure 110 prior to assembly. In the embodiment of FIG. 25, circuit board 240 includes a semiconductor element 410 and a thermal interface 420, as also illustrated in each of the embodiments of FIGS. 11, 12, 15, 16, 19, 20, 23, and 24. FIG. 25 also illustrates a heat spreader plate 210 as illustrated in each of the embodiments of FIGS. 9-24, and a second heat spreader plate 610 as illustrated in each of the embodiments of FIGS. 13-16, and 21-24. In the embodiment of FIG. 25, the enclosure 110 includes supports 310 to support the circuit board 240. FIG. 25 also illustrates the upper surface 250 of the upper portion 270 of enclosure 110 and the lower surface 260 of the lower portion 280 of the enclosure 110 as also illustrated in each of the embodiments of FIGS. 9-24. In the embodiment of FIG. 18, there are four ribbed posts 230, where the fourth ribbed post is not illustrated, as also illustrated in each of the embodiments of FIGS. 10, 12, 14, 16, 18, 20, 22, and 24. In FIG. 25, there are four adjustment holes 220 at each of four corners of the heat spreader plate 210, where the fourth adjustment hole is not illustrated, as also illustrated in each of the embodiments of FIGS. 10, 12, 14, 16, 18, 20, 22, and 24. In the embodiment of FIG. 25, there are four ribbed posts 630 at each of four corners of the lower portion 280 of enclosure 110, where only a single ribbed post is illustrated, as also illustrated in each of the embodiments of FIGS. 14, 16, 22, and 24. In FIG. 25, there are four adjustment holes 620 at each of four corners of the second heat spreader plate 610, where the fourth adjustment hole is not illustrated, as also illustrated in each of the embodiments of FIGS. 14, 16, 22, and 24.

Figure 26:
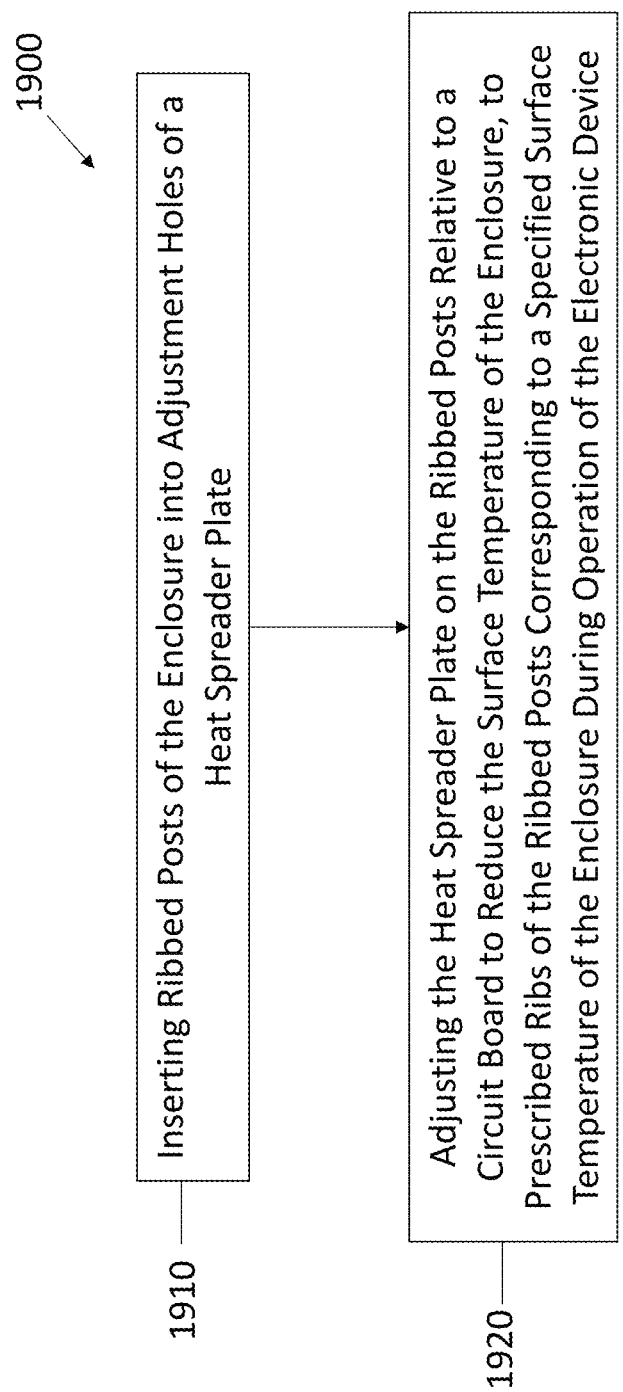
FIG. 26 is a flowchart illustrating an exemplary embodiment of a method of manufacturing an embodiment of an electronic device.

FIG. 26 is a flowchart 1900 illustrating an exemplary embodiment of a method of manufacturing an embodiment of an electronic device. In the embodiment of FIG. 26, the first step 1910 involves inserting at least two ribbed posts of an enclosure into two adjustment holes of a heat spreader plate, where the heat spreader plate spreads heat emitted by a circuit board. Following step 1910, at step 1920, the heat spreader plate is adjusted on the ribbed posts relative to the circuit board to reduce the surface temperature of the enclosure. The adjustment of the heat spreader plate is to select ribs of the ribbed posts corresponding to a specified surface temperature of the enclosure during operation of the electronic device.

In connection with the embodiment of FIG. 26, the manufacturing and technical specifications of the electronic device includes specific requirements regarding surface temperature when the electronic device is in operation. As discussed above, placement of the heat spreader closer to circuit board and away from a surface of the enclosure will generally result in lower surface temperatures of the enclosure during operation of the electronic device. Conversely, placement of the heat spreader further away from the circuit board and towards the surface of the enclosure will generally result in higher surface temperatures of the enclosure during operation of the electronic device. As such, surface temperatures can be mitigated and controlled by prescribing locations of the heat spreader on the ribbed posts in accordance with a manufacturing specification.

Additionally, the same heat transfer apparatus with heat spreader plates as disclosed herein may be used during the manufacture of different electronic devices, where those different electronic devices have different specific requirements regarding surface temperature when the electronic devices are in operation. In that circumstance, the adjustability of the heat spreader plate or plates allows the same heat transfer apparatus to be used in the manufacture of multiple different electronic devices, where the heat spreader plate or plates are prescribed to be closer to a circuit board during manufacture of a first electronic device and the heat spreader plate or plates are prescribed to be further away from a circuit board during manufacture of a second electronic device as compared to the prescription for the first electronic device. This avoids the expense and time of developing a customized heat transfer apparatus for each electronic device. In other circumstances different customers of the same electronic device may have different temperature requirements, and the system and apparatus of the present disclosure allows an electronic device to be manufactured to the customer specification. For example, Customer A may have a surface temperature specification limited to 20-degrees Celsius above ambient temperature, while a second Customer B has a specification at 25-degrees Celsius above ambient temperature, for the same electronic device. With the presently disclosed heat transfer system and apparatus, both electronic devices may be manufactured to within the customer specification using the same heat transfer apparatus with its adjustable heat spreader plate or plates, in accordance with the embodiments disclosed herein. This avoids the expense and time of developing a customized heat transfer apparatus for each customer implementation of the electronic device.

Figure 27:
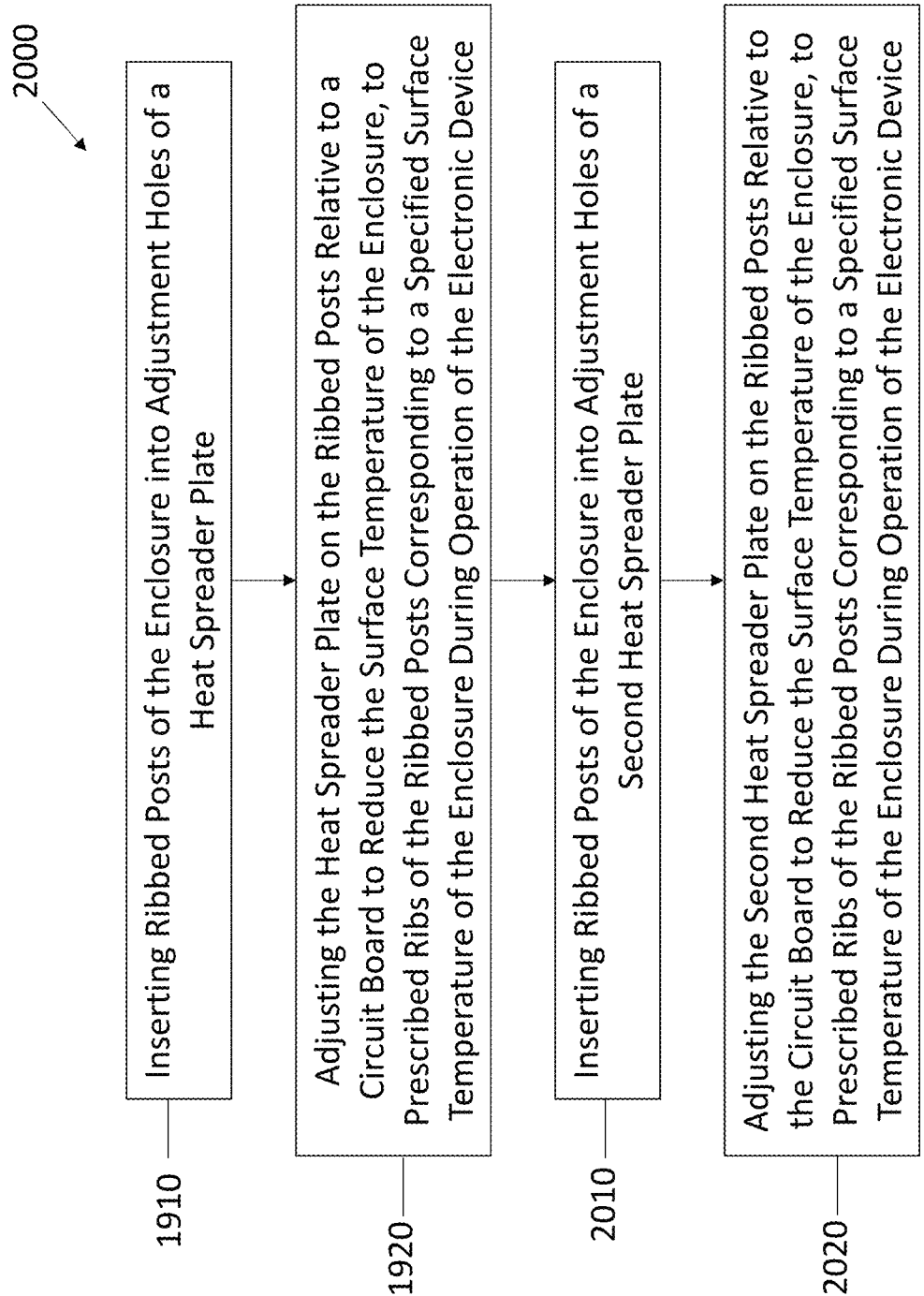
FIG. 27 is a flowchart illustrating an exemplary embodiment of method of manufacturing an embodiment of an electronic device with two heat spreader plates.

FIG. 27 is a flowchart 2000 illustrating an exemplary embodiment of method of manufacturing an embodiment of an electronic device with two heat spreader plates. In the embodiment of FIG. 27 steps 1910 and 1920 correspond to the same steps as those in FIG. 26, and as explained above with respect to FIG. 26. In addition, step 2010 involves inserting at least two ribbed posts of an enclosure into two adjustment holes of a second heat spreader plate, where the second heat spreader plate spreads heat emitted by the circuit board. Following step 2010, at step 2020, the second heat spreader plate is adjusted on the ribbed posts relative to the circuit board to reduce the surface temperature of the enclosure. The adjustment of the second heat spreader plate is to select ribs of the ribbed posts corresponding to a specified surface temperature of the enclosure during operation of the electronic device.

Although in the foregoing description, terms such as "top," "bottom," "front," "back," "right," "left," "upper," and "lower" were used for ease of description and illustration, no restriction is intended by such use of the terms. The telecommunications devices described herein can be used in any orientation, depending upon the desired application.

Techniques consistent with the present disclosure provide, among other features, an apparatus and system for temperature mitigation and, more particularly, a flexible heat spreader attachment that flexibly attaches to the periphery of a circuit board, allowing for its use with numerous circuit board shapes and sizes, including those of irregular shapes and sizes.

Techniques consistent with the present disclosure also provide, among other features, a heat transfer apparatus and system for surface and component temperature mitigation for electronic devices such as set-top boxes with at least one circuit board, which provides specific surface temperature or component temperature control and mitigation.

While various exemplary embodiments of the disclosed system and method have been described above it should be understood that they have been presented for purposes of example only, not limitations. It is not exhaustive and does not limit the disclosure to the precise form disclosed. Modifications and variations are possible in light of the above teachings or may be acquired from practicing of the disclosure, without departing from the breadth or scope.

What is claimed is:

1. A flexible heat spreader attachment, comprising:
   a base plate;
   a heat spreader attached to the base plate; and
   four adjustable arms attached to the base plate, wherein each of the adjustable arms comprise a plurality of circuit board hooks configured to:
      attach to the periphery of a circuit board and maintain the heat spreader at a desired location on, and spaced from, the circuit board, and
      adjust the spatial distance of the heat spreader to the desired location on, and spaced from, the circuit board.

2. The flexible heat spreader attachment of claim 1, wherein the adjustable arms are configured to extend and retract in length.

3. The flexible heat spreader attachment of claim 1, wherein the adjustable arms are configured to pivot in a plane parallel to the base plate.

4. The flexible heat spreader attachment of claim 1, wherein each adjustable arm comprises two sub-adjustable arms with two pivot hinges.

5. The flexible heat spreader attachment of claim 1, wherein the heat spreader is configured to thermally interface with a semiconductor element of the circuit board through thermal interface material.

6. The flexible heat spreader attachment of claim 1, wherein the heat spreader is configured to attach to the bottom of the circuit board to reduce the intensity of an isolated hot spot on the bottom of the circuit board, the base plate having smaller size than the size of the circuit board.

7. An enclosure for a circuit board, comprising:
   a flexible heat spreader attachment comprising a base plate, a heat spreader attached to the base plate, and four adjustable arms attached to the base plate, wherein each of the adjustable arms comprise a plurality of circuit board hooks configured to:
   attach to the periphery of the circuit board and maintain the heat spreader at a desired location on, and spaced from, the circuit board, and
   adjust the spatial distance of the heat spreader to the desired location on, and spaced from, the circuit board.

8. The enclosure of claim 7, wherein the adjustable arms are configured to extend and retract in length.

9. The enclosure of claim 7, wherein the adjustable arms are configured to pivot in a plane parallel to the base plate.

10. The enclosure of claim 7, wherein each adjustable arm comprises two sub-adjustable arms with two pivot hinges.

11. The enclosure of claim 7, wherein the heat spreader is configured to thermally interface with a semiconductor element of the circuit board through thermal interface material.

12. The enclosure of claim 7, wherein the heat spreader is configured to attach to the bottom of the circuit board to reduce the intensity of an isolated hot spot on the bottom of the circuit board.

13. A method of manufacturing an electronic device including a circuit board, comprising:
   deploying a flexible heat spreader attachment comprising a base plate, a heat spreader attached to the base plate, and four adjustable arms attached to the base plate;
   attaching circuit board hooks of the four adjustable arms of the flexible heat spreader attachment to the periphery of the circuit board to maintain the heat spreader at a desired location on, and spaced from, the circuit board; and
   adjusting the spatial distance of the heat spreader to the desired location on, and spaced from, the circuit board using the circuit board hooks of the four adjustable arms.

14. The method of manufacturing of claim 13, wherein the adjustable arms are configured to extend and retract in length.

15. The method of manufacturing of claim 13, wherein the adjustable arms are configured to pivot in a plane parallel to the base plate.

16. The method of manufacturing of claim 13, wherein each adjustable arm comprises two sub-adjustable arms with two pivot hinges.

17. The method of manufacturing of claim 13, wherein attaching the circuit board hooks of the flexible heat spreader attachment includes attaching the flexible heat spreader attachment to the bottom of the circuit board to reduce the intensity of an isolated hot spot on the bottom of the circuit board, the base plate having smaller size than the size of the circuit board.

* * * * *